(12) United States Patent
Ito et al.

(10) Patent No.: US 8,222,082 B2
(45) Date of Patent: Jul. 17, 2012

(54) SEMICONDUCTOR DEVICE AND A METHOD OF MANUFACTURING THE SAME

(75) Inventors: Niichi Ito, Tokyo (JP); Tetsuji Nakamura, Tokyo (JP); Takamitsu Nagaosa, Itami (JP); Hisashi Okamura, Itami (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 543 days.

(21) Appl. No.: 12/367,297

(22) Filed: Feb. 6, 2009

(65) Prior Publication Data

US 2009/0212425 A1 Aug. 27, 2009

(30) Foreign Application Priority Data

Feb. 25, 2008 (JP) ................... 2008-042695

(51) Int. Cl.
*H01L 21/77* (2006.01)
*H01L 21/603* (2006.01)
(52) U.S. Cl. ....................... 438/111; 438/123
(58) Field of Classification Search .................. 438/111, 438/119, 123
See application file for complete search history.

(56) References Cited

U.S. PATENT DOCUMENTS

| 6,590,297 B2 | 7/2003 | Sasaki |
| 2002/0180025 A1* | 12/2002 | Miyata et al. ................. 257/690 |
| 2008/0080111 A1* | 4/2008 | Lin et al. ........................ 361/56 |

FOREIGN PATENT DOCUMENTS

| JP | 11-087400 A | 3/1999 |
| JP | 2003-273154 A | 9/2003 |

* cited by examiner

*Primary Examiner* — Zandra Smith
*Assistant Examiner* — Pamela E Perkins
(74) *Attorney, Agent, or Firm* — Miles & Stockbridge P.C.

(57) ABSTRACT

A technique is provided which allows a chip mounted by wire bonding and a chip mounted by bump electrodes to share a manufacturing process. Both in a case where a chip is electrically coupled to an external circuit by bump electrodes and a case where the chip is electrically coupled to the external circuit by bonding wires, a bump coupling part and a bonding pad are both provided in a single uppermost wiring layer. When the bump electrodes are used, an opening is provided in an insulating film on the bump coupling part and a surface of the bonding pad is covered with the insulating film. On the other hand, when the bonding wires are used, an opening is provided in an insulating film on the bonding pad and a surface of the bump coupling part is covered with the insulating film.

14 Claims, 26 Drawing Sheets

SEMICONDUCTOR DEVICE AND A METHOD OF MANUFACTURING THE SAME

CROSS-REFERENCE TO RELATED APPLICATIONS

The disclosure of Japanese Patent Application No. 2008-42695 filed on Feb. 25, 2008 including the specification, drawings and abstract is incorporated herein by reference in its entirety.

BACKGROUND OF THE INVENTION

The present invention relates to a semiconductor device and a technique of manufacturing the same. More particularly, it relates to a technique which is effectively applicable when electrically coupling a semiconductor chip with an external circuit.

When building an LSI of a ball grid array structure, it is possible for the LSI to assume the configuration of a BGA (Ball Grid Array) type, a CSP using a rewiring structure, or a bump electrode structure.

Wire bonding as a package is required in the BGA type, and rewiring of semiconductor chips on a passivation film is required in the rewiring structure. These are coupled to pads provided in an IO region of the LSI chip.

On the other hand, as for the bump electrode structure, on the uppermost metal wiring layer in the LSI chip, coupling to balls making up the bump electrode is made. Therefore, the power-supply wiring and GND wiring are directly coupled to the lower wiring layer without using an IO cell, having a structure without pads.

As described above, a layout of the BGA type as well as the rewiring structure and that of the bump electrode structure are different. Therefore, when the above two package structures are provided on the same LSI, exclusive masks for providing opening in the uppermost-layer wiring must be prepared separately.

Japanese Unexamined Patent Publication No. 2003-273154 (Patent Document 1) discloses a technique as follows. That is, first, near four corners of a surface of the active device in a semiconductor-chip region, there is formed a metal wiring layer having both a pad region for wire bonding and a pad region for rewiring. Furthermore, a surface of the metal wiring layer is covered with a passivation film. Then, in accordance with the packaged state of the semiconductor chip, the passivation film on either the pad region for wire bonding or the pad region for rewiring is selectively removed to allow opening. The above technique makes it possible to allow the semiconductor chip to cope with a package with lead terminals or a CSP (Chip Size Package) without raising a cost and increasing the size of the semiconductor device.

According to a technique disclosed in Japanese Unexamined Patent Publication No. 11-87400 (Patent Document 2), there is formed an integrated circuit on a semiconductor chip, which has pad parts for electrically coupling the integrated circuit with an external circuit. Each of the pad parts is provided with two junctions including openings selectively formed in protective films which cover the pad parts. With this structure, the integrated circuit can be electrically coupled to the external circuit either by use of wire bonding or by use of bump electrodes, thereby improving development efficiency and mass production efficiency of the semiconductor device.
(Patent Document 1)
Japanese Unexamined Patent Publication No. 2003-273154
(Patent Document 2)
Japanese Unexamined Patent Publication No. Hei 11 (1999)-87400

SUMMARY OF THE INVENTION

However, the technique disclosed in Patent Document 1 is predicated on the rewiring structure. Also, its ordinary rewiring structure is the one for coupling to pads which are coupled to an IO cell. Therefore, in the case of Patent Document 1, it is necessary to prepare pad regions for rewiring corresponding to the number of pads for wire bonding. Accordingly, when the number of pads for wire bonding needed in the semiconductor chip increases, it is necessary to increase the number of pad regions for rewiring by the same number as well as to increase the number of bump electrodes to be formed on the rewiring by the same number. This prevents the semiconductor chip (hereinafter, simply called a "chip") from being made compact.

Further, in the case of the technique disclosed in Patent Document 2, when it is a packaged state using bump electrodes, the junction for wire bonding is opened and always exposed. Therefore, there is a possibility of occurrence of corrosion etc. at the junction for wire bonding. Moreover, when it is a package using wire bonding, bump electrodes are also formed, causing a short between the wire and the bump electrodes.

Also, another object of the present invention is to provide a technique allowing a semiconductor device to be compact.

The above mentioned and further objects and novel features of the present invention will become apparent from the description provided in this specification and the attached drawings.

Outlines of representative aspects and features of the invention disclosed in the present application will be briefly described as follows.

(1) A method of manufacturing a semiconductor device according to the present invention comprises the steps of: (a) forming an integrated circuit in each of a plurality of chip areas on a semiconductor substrate partitioned into the plural chip areas by a scribe area; (b) forming, in an upper layer of the integrated circuit, a first wiring extending from a first circuit region to a second circuit region and being electrically coupled to the integrated circuit in each of the plural chip areas; (c) defining part of the first wiring of the first circuit region as a first pad and defining part of the first wiring of the second circuit region as a second pad; (d) forming a protective film on the semiconductor substrate under the presence of the first wiring; (e) forming an opening in the protective film on either the first pad or the second pad; (f) cutting the semiconductor substrate along the scribe area and dividing the semiconductor substrate into individual semiconductor chips; (g) mounting each of the semiconductor chips on a mounting substrate and, through bonding wires or bump electrodes, electrically coupling each of the semiconductor chips with the mounting substrate, wherein, in the step (g), at the time of electrically coupling each of the semiconductor chips with the mounting substrate through the bonding wires, the opening is formed in the protective film on the first pad in the step (e) and the bonding wire is coupled to the first pad under the opening in the step (g); wherein, at the time of electrically coupling each of the semiconductor chips with the mounting substrate in the step (g) through the bump electrodes, the opening is formed in the protective film on the second pad in the step (e) and, further, under the opening, the bump electrode to be coupled to the second pad is formed on the second pad.

(2) A semiconductor device according to the present invention comprises: a semiconductor chip having an integrated circuit on a main surface thereof in which there are defined first circuit regions including a plurality of input-output circuits arranged along a peripheral edge thereof and a second circuit region arranged between the first circuit regions; and bump electrodes formed on the second circuit region and electrically coupled to the integrated circuit.

(3) According to a semiconductor device of the present invention, in the semiconductor device described in the item (2), a third circuit region which is closer to a center of the semiconductor chip than the first circuit region and the second circuit region is defined, wherein the second circuit region and the bump electrode are further arranged between the first circuit region and the third circuit region; and wherein, of the bump electrodes, one or neighboring two bump electrodes between the first circuit regions above the second circuit region and one bump electrode or two neighboring bump electrodes between the first circuit region and the third circuit region above the second circuit region are arranged such that an equilateral triangle is formed by coupling those bump electrodes as vertexes.

Effects of representative ones of the inventions disclosed in the present application will be briefly described as follows.

(1) The manufacturing process can be shared between a chip to be mounted by use of wire bonding and a chip to be mounted by use of bump electrodes.

(2) The semiconductor device can be made compact.

DETAILED DESCRIPTION OF THE PREFERRED EMBODIMENTS

Figure 1:
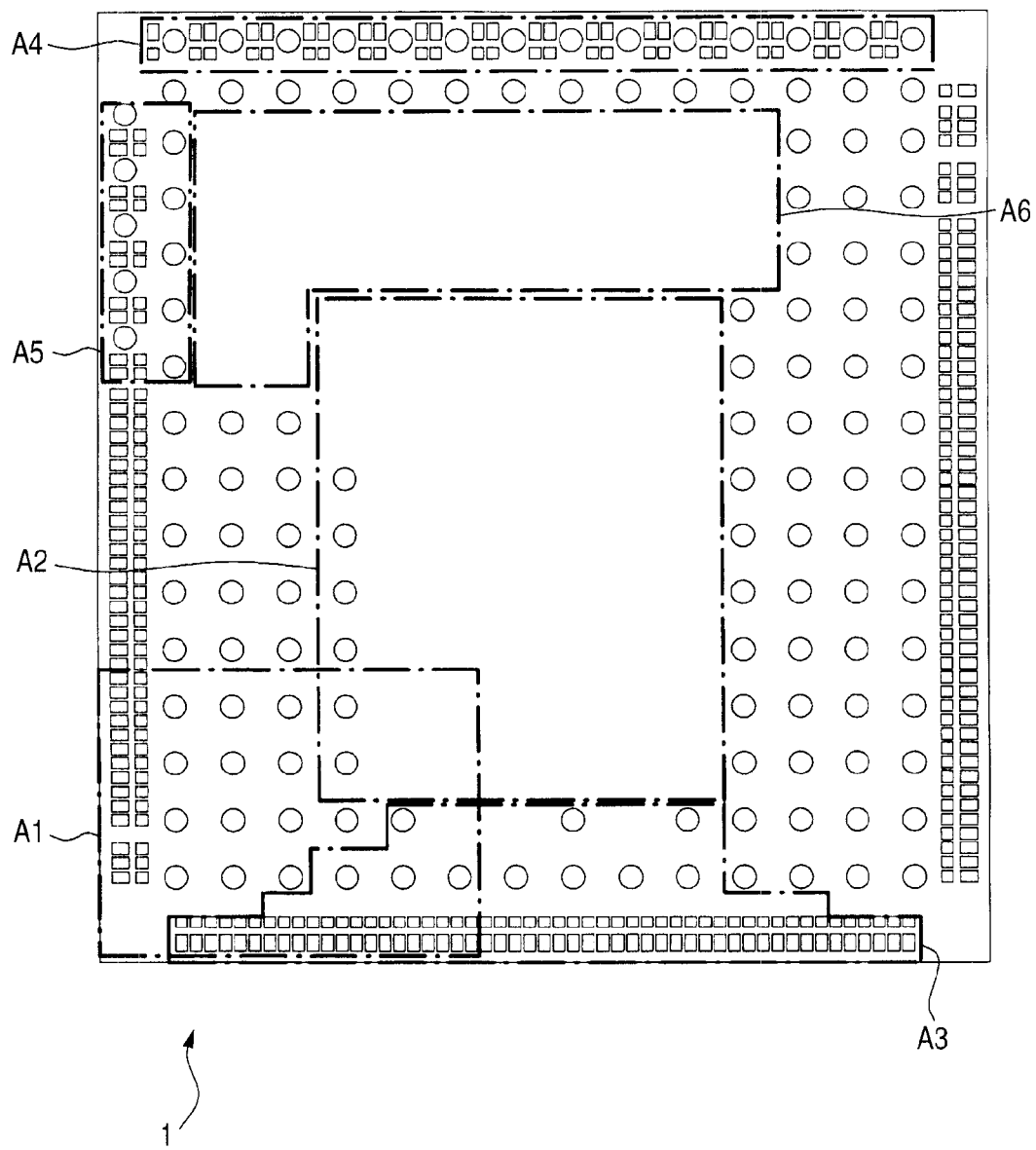
FIG. 1 is a plan view of a chip included in a semiconductor device according to an embodiment of the present invention.

In the following embodiments, individual embodiments may be divided into a plurality of sections or embodiments for the sake of convenience, if necessary, to be described. Unless otherwise specified, they are not mutually irrelevant, but one may be in the relation of a varied example, a detail, or a supplemental statement of a part or the whole of the other.

Further, in the following embodiments, when reference is made to the numbers of statement, and the like (including the number, numerical value, amount, range, and the like), except when otherwise specified, and except when such numbers are apparently limited to specific numbers in principle, they are not limited to the specific numbers, and may be either equal to, or larger than, or equal to, or smaller than the specific numbers.

Still further, in the following embodiments, it is needless to say that, the constituent elements (including elemental steps and the like) are not necessarily essential, except when otherwise specified, and except when they are presumed to be apparently essential in principle. Further, with respect to the constituent elements in examples etc., when mentioning "It comprises A" or "It is comprised of A," except when A is apparently limited to a specific element, other elements are acceptable.

Likewise, in the following embodiments, when reference is made to the shape and positional relationship of constituent elements, and the like, they are construed as including the ones substantially analogous or similar to the shape, and the like, except when otherwise specified and except when they are presumed to be apparently not so in principle. This is also true of the foregoing numerical values and ranges.

Moreover, where reference is made to the materials etc., unless otherwise specified, or except when they are presumed to be apparently not so in principle and in the situation, the specified material is a main ingredient and secondary elements, additives, and addition of other elements are acceptable. For example, where reference is made to silicon members, they are construed as generally including, other than pure silicon, unless otherwise specified, binary alloys, ternary alloys, etc. (for example, SiGe) containing those obtained by adding impurities and silicon as main ingredients.

Moreover, throughout the drawings for illustrating the embodiments, the elements having the same function are represented by the same reference numerals and characters, and the repeated description thereon is omitted.

Further, in the drawings of the present embodiments, even in a plan view, hatching may be provided partially for easy viewing.

Hereafter, detailed explanation will be given of embodiments of the present invention with reference to drawings.

Embodiment 1

Figure 2:
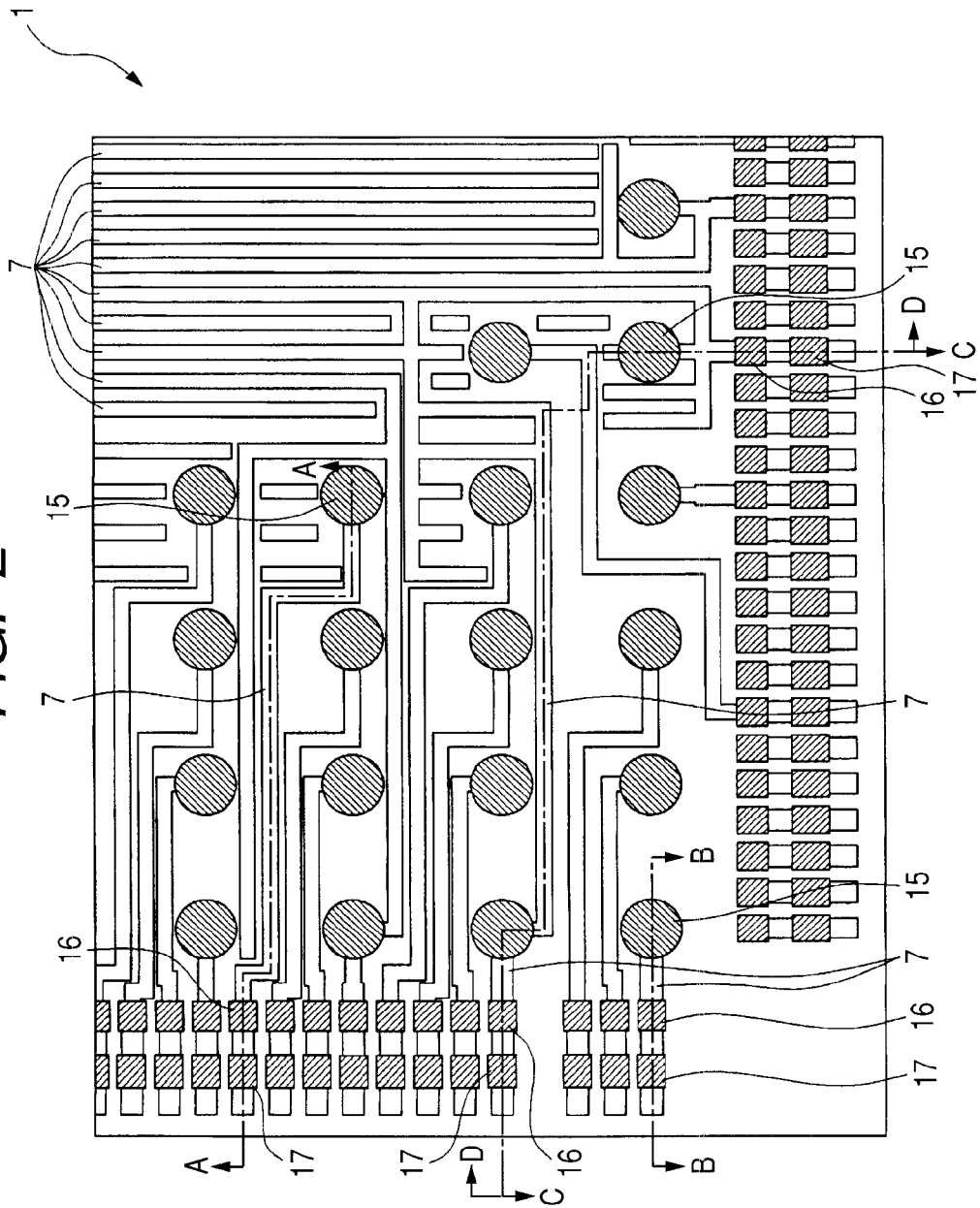
FIG. 2 is a plan view of an essential part in which a portion of FIG. 1 is enlarged.
Figure 3:
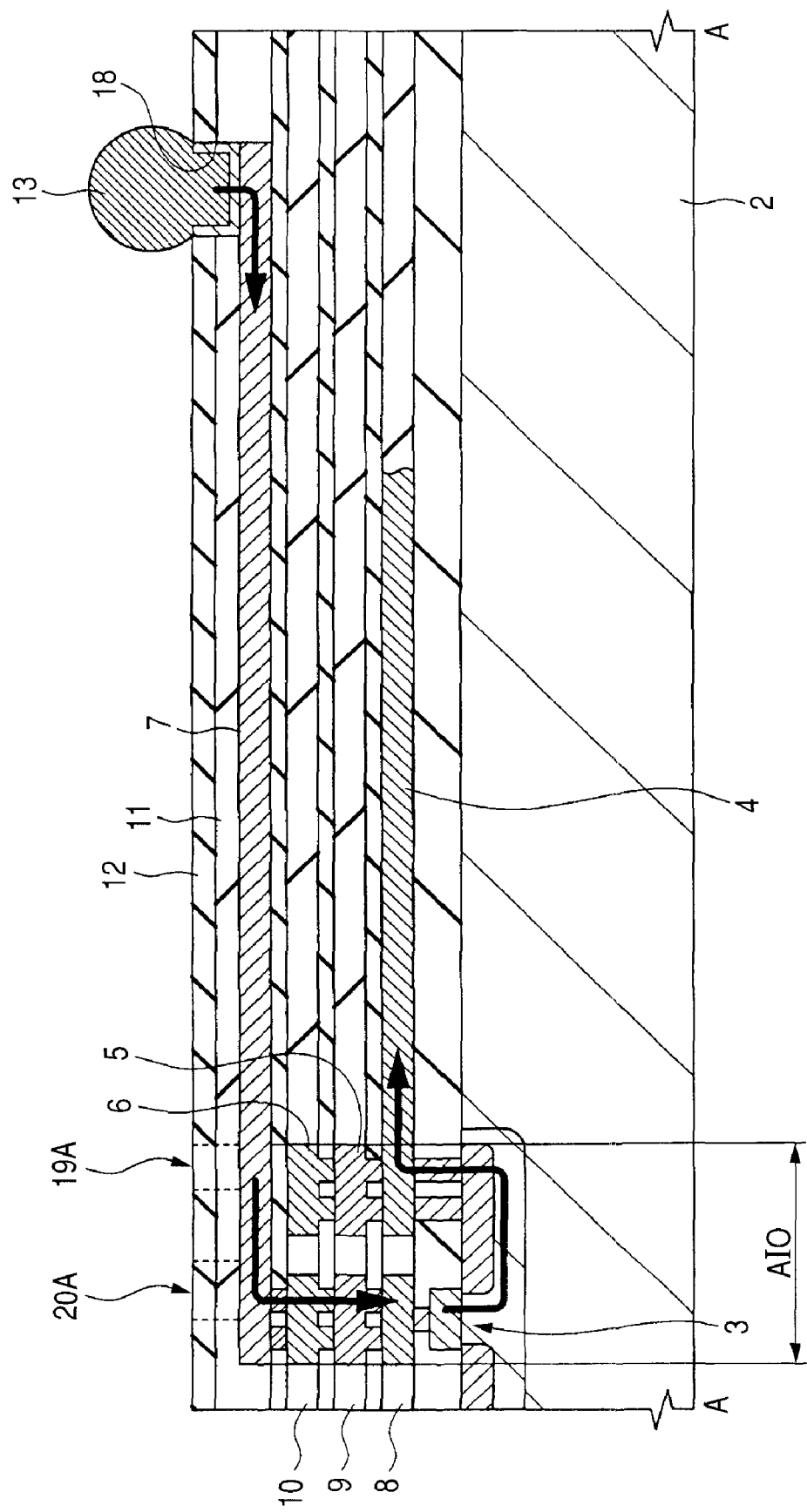
FIG. 3 is a sectional view of an essential part taken along line A-A in FIG. 2.
Figure 4:
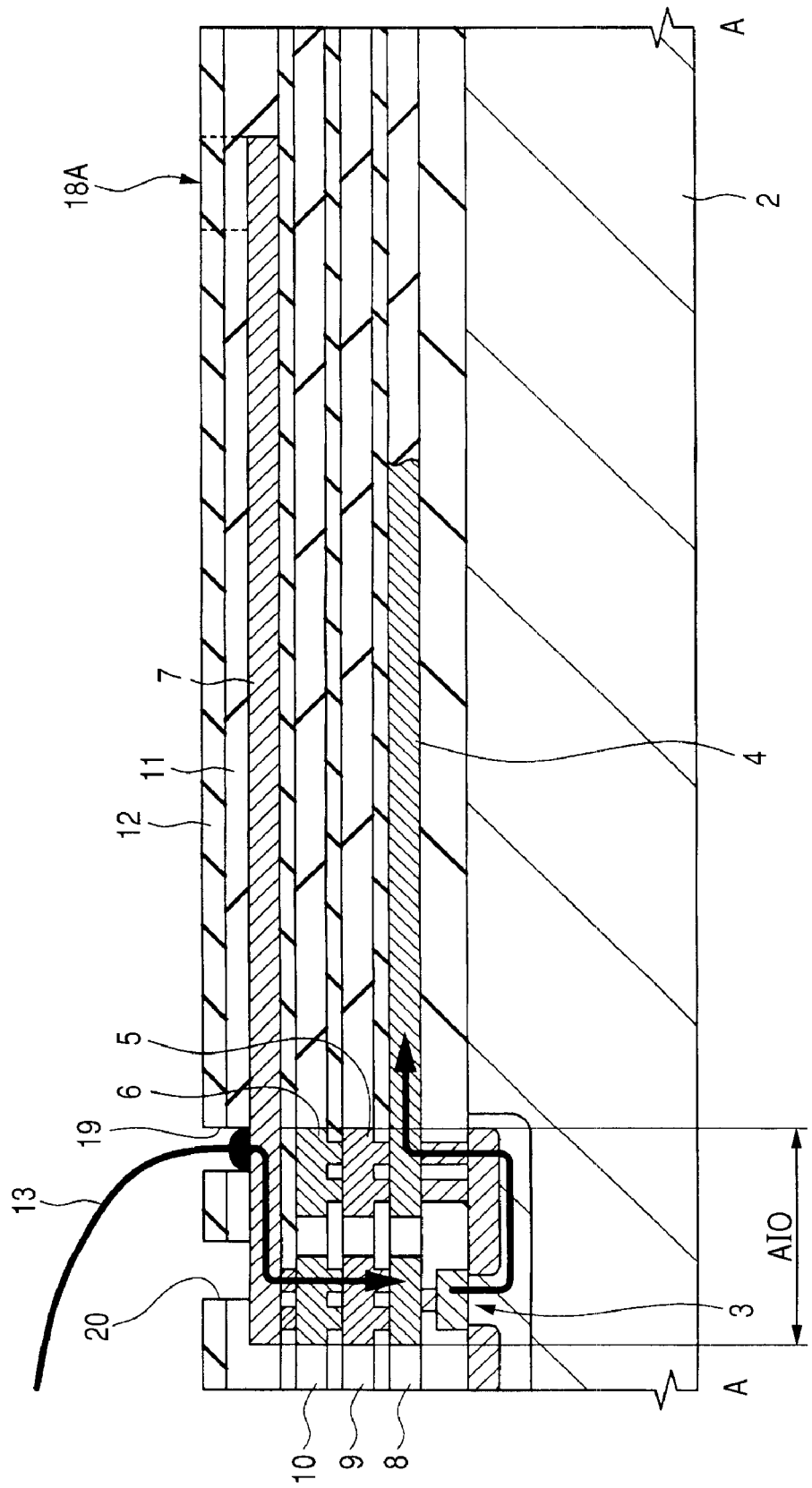
FIG. 4 is a sectional view of an essential part taken along line A-A in FIG. 2.
Figure 5:
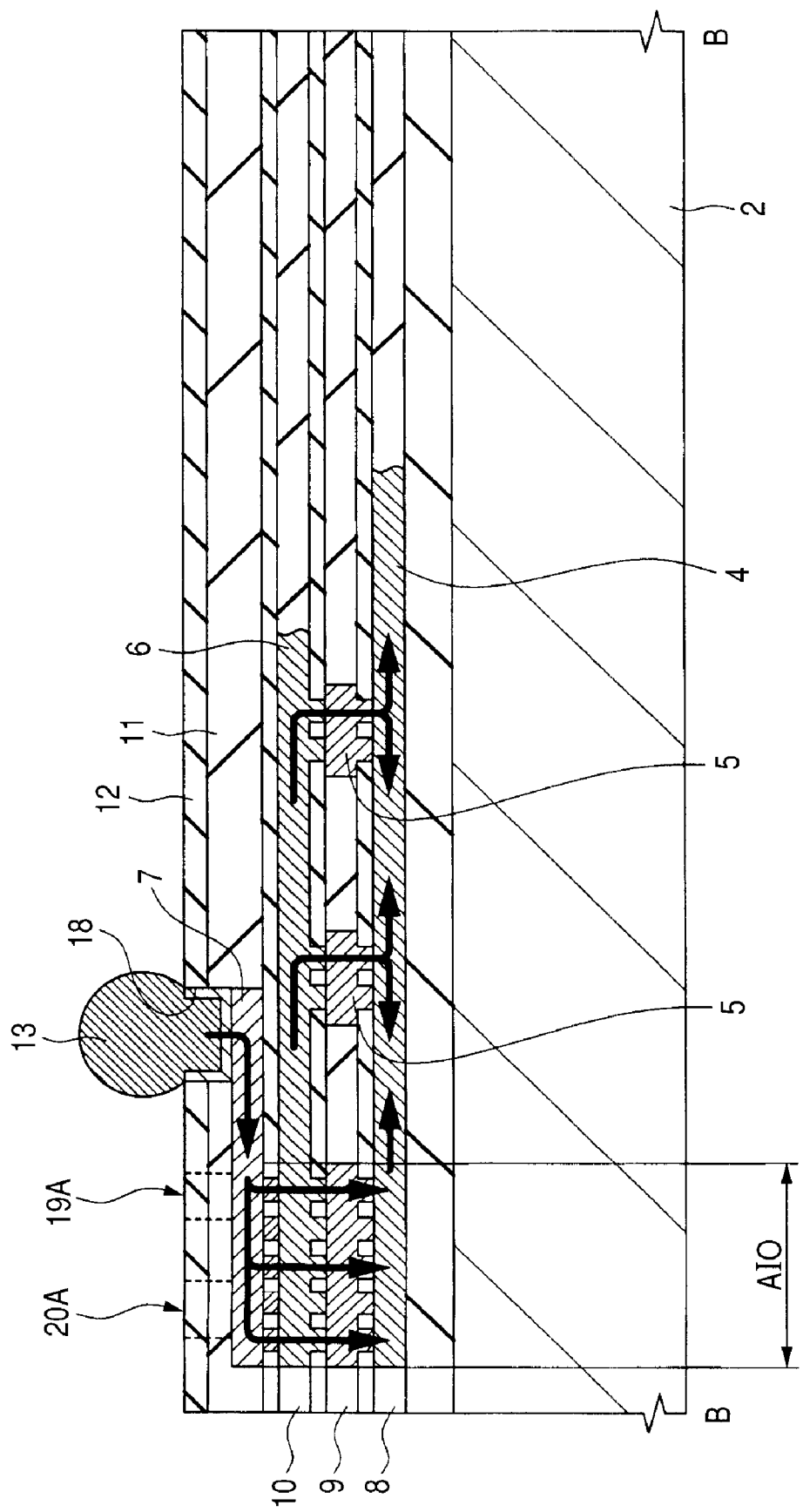
FIG. 5 is a sectional view of an essential part taken along line B-B in FIG. 2.
Figure 6:
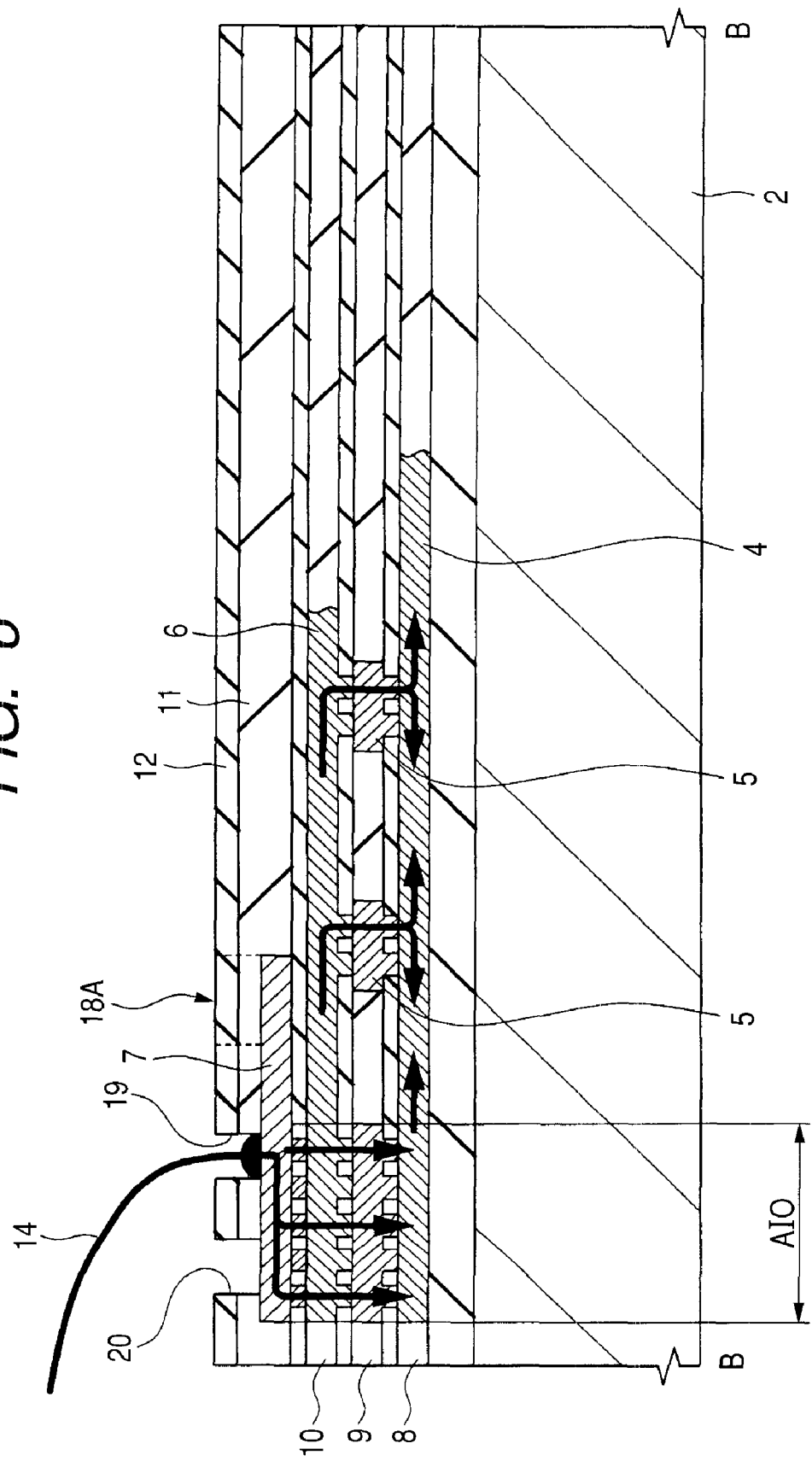
FIG. 6 is a sectional view of an essential part taken along line B-B in FIG. 2.
Figure 7:
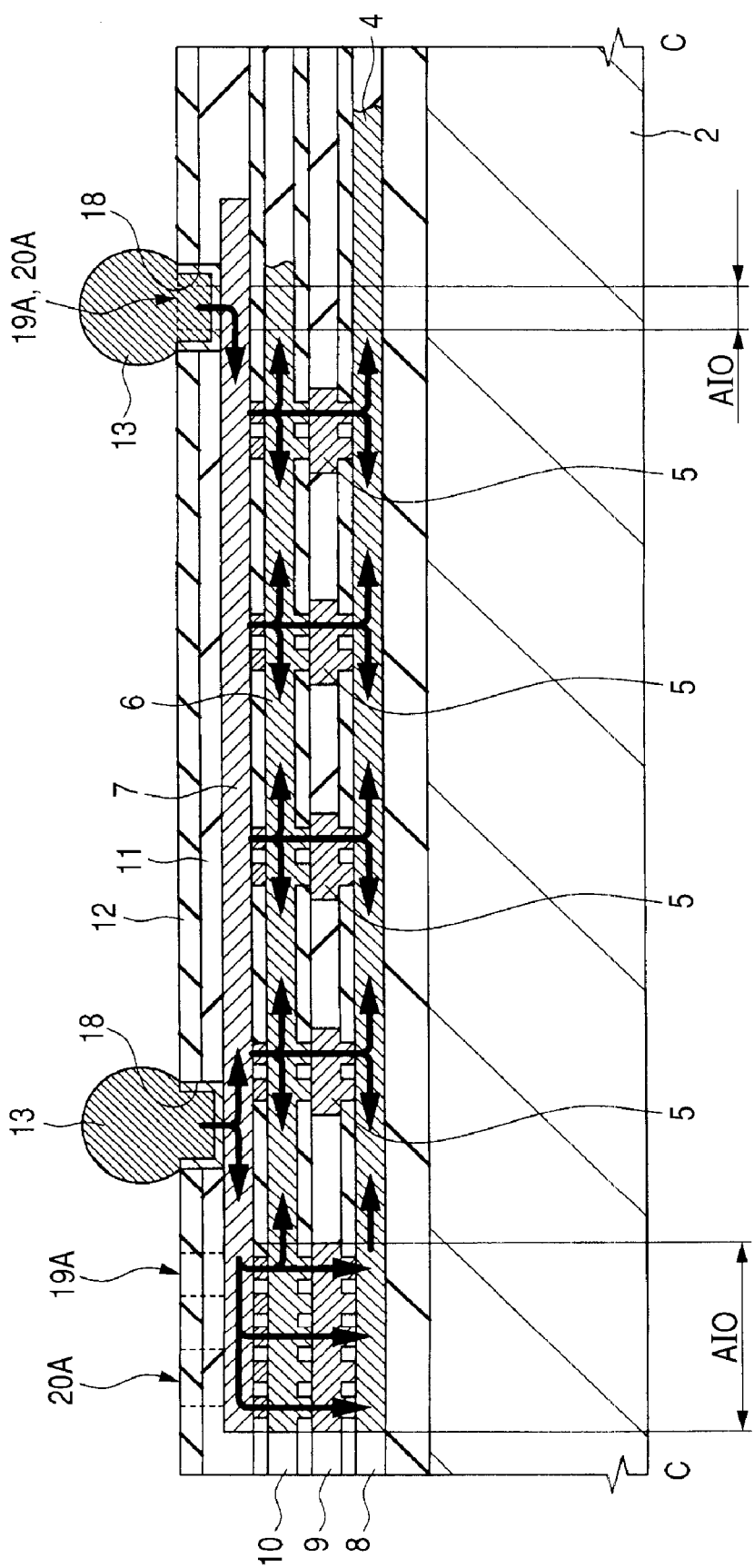
FIG. 7 is a sectional view of an essential part taken along line C-C in FIG. 2.
Figure 8:
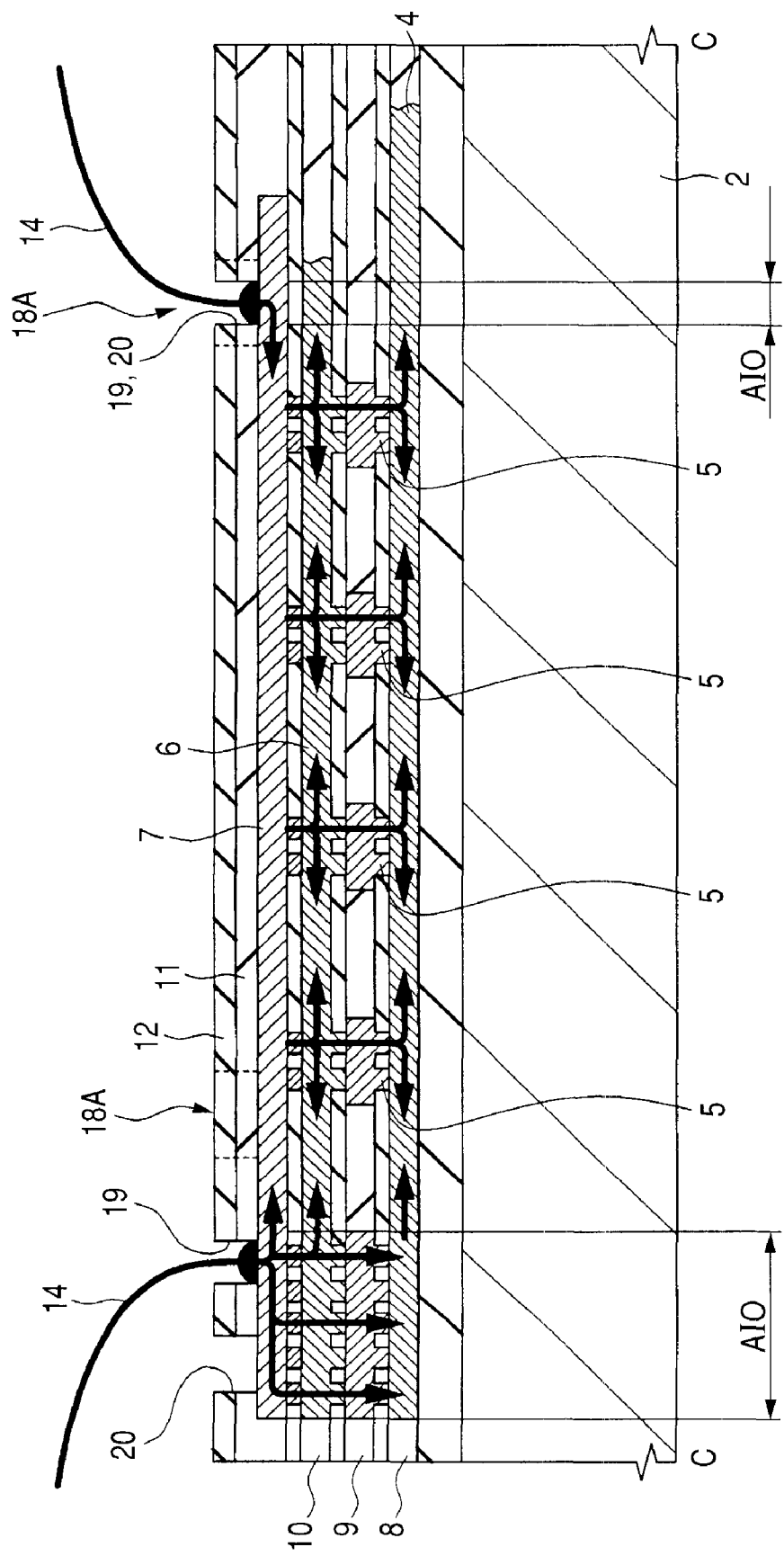
FIG. 8 is a sectional view of an essential part taken along line C-C in FIG. 2.
Figure 9:
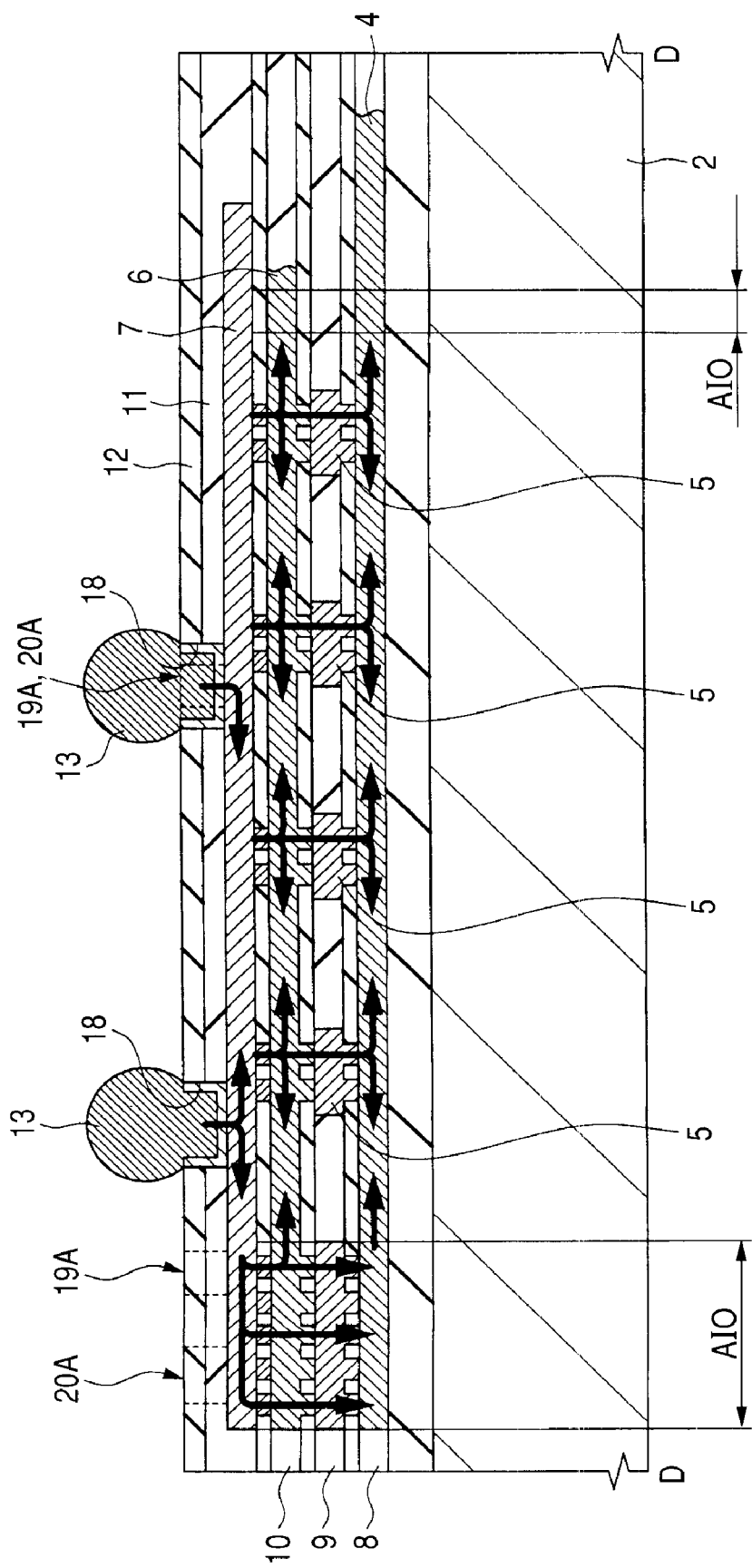
FIG. 9 is a sectional view of an essential part taken along line D-D in FIG. 2.
Figure 10:
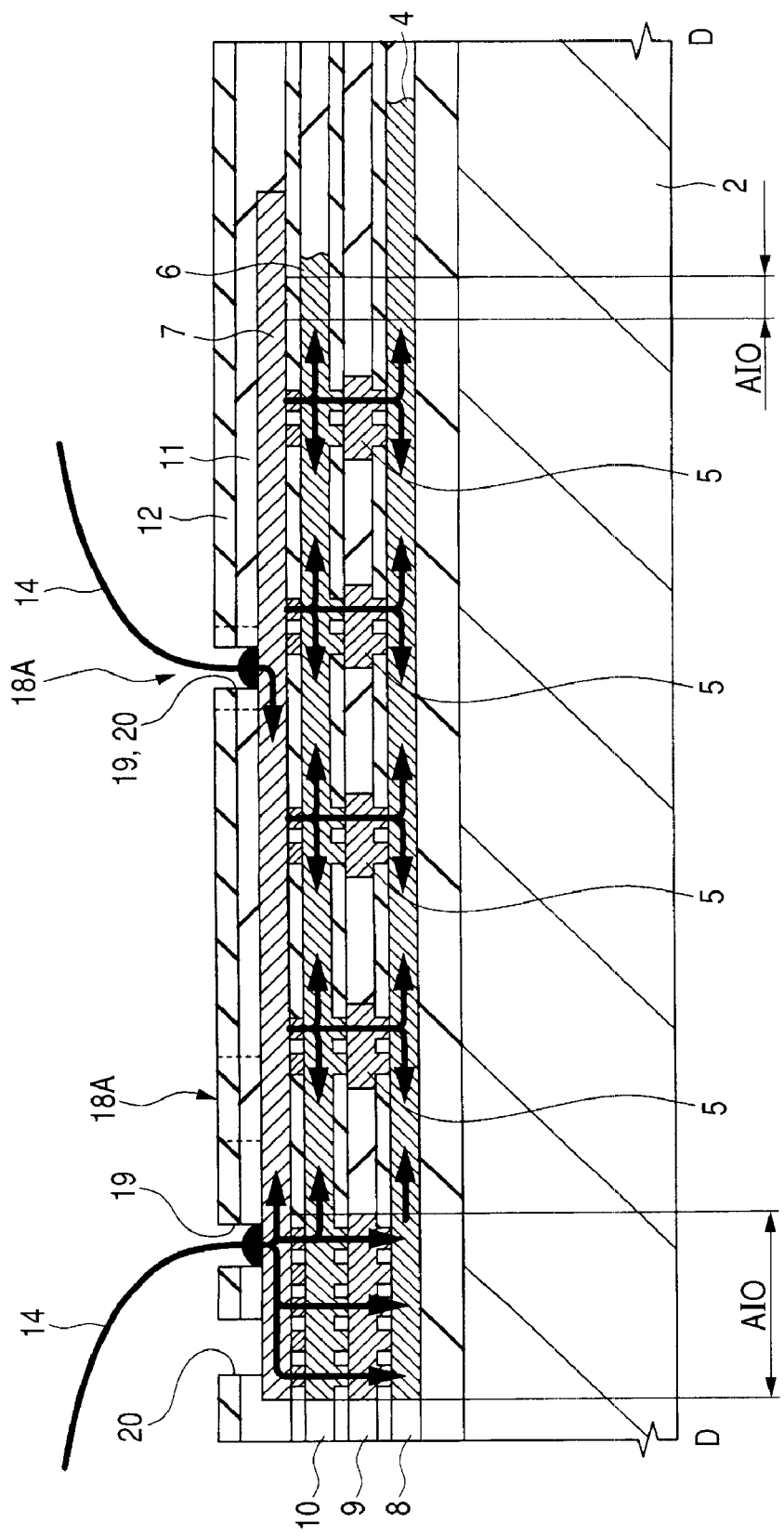
FIG. 10 is a sectional view of an essential part taken along line D-D in FIG. 2.
Figure 11:
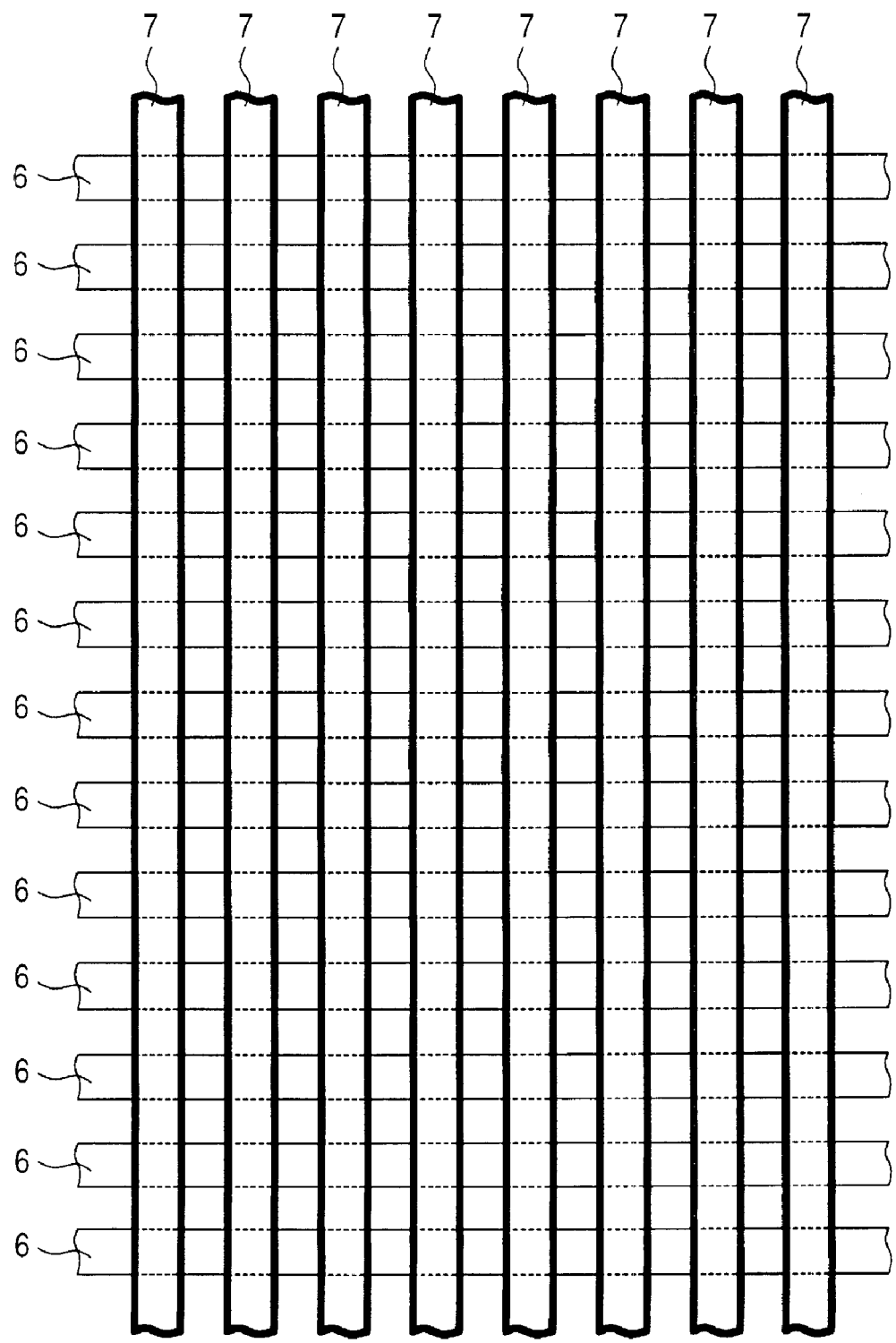
FIG. 11 is a plan view of an essential part illustrating a wiring pattern for a power supply/GND formed in a chip included in a semiconductor device according to an embodiment of the present invention.

The semiconductor device of Embodiment 1 is, for example, a semiconductor device of a BGA type. FIG. 1 is a plan view illustrating a layout of a chip 1 included in the semiconductor device of Embodiment 1. Further, FIG. 2 is a plan view of an essential part in which a region A1 of FIG. 1 is enlarged, and FIGS. 3 and 4 are sectional views taken along line A-A in FIG. 2. FIGS. 5 and 6 are sectional views taken along line B-B in FIG. 2; FIGS. 7 and 8 are sectional views taken along line C-C in FIG. 2; and FIGS. 9 and 10 are sectional views taken along line D-D in FIG. 2. Moreover, FIGS. 3 and 4 show the coupled state of electrodes for external coupling (bump electrodes or bonding pads for bonding wire coupling) and wires for sending and receiving signals. FIGS. 5 to 10 show the coupled state of the electrode for external coupling and wiring for power supply/GND (reference potential). Thick arrows in FIGS. 3 to 10 shows electric-current paths. FIG. 11 shows a layout (a plane) of the wiring formed in a region A2 in FIG. 1.

As shown in FIGS. 1 to 11, in the chip 1, on a main surface of a semiconductor substrate 2 made of, for example, single crystal silicon, there are provided a semiconductor element 3 such as a MISFET (Metal Insulator Semiconductor Field Effect Transistor) and wirings 4 to 7 etc. electrically coupled with the semiconductor element 3. The wirings 4 to 6 are formed, for example, by embedding copper or an ally of copper in a groove for wiring formation made in interlayer dielectric films 8 to 10 made of, for example, silicon oxide film etc. As for a groove in which the wiring 5 formed in an upper layer of the wiring 4 and the wiring 6 formed in an upper layer of the wiring 5 are formed, there are provided, at the bottom, holes for coupling with the lower layer wiring. By embedding the copper or the ally of copper in the groove and holes collectively, plugs for coupling with the lower layer wiring and the wirings are integrally formed. Further, on the side wall and bottom face of the groove and holes in which the wirings 4 to 6 are formed, in order to prevent diffusion of the copper being an ingredient of the wirings 4 to 6 to the interlayer dielectric films 8 to 10, there are formed a single layer film of titan, titan nitride, tantalum, tantalum nitride, etc. or a multilayered film of these films as a barrier insulating layer, which is not shown in FIGS. 3 to 10. The wiring of the uppermost layer (a first wiring) 7 is, for example, a wiring using an aluminum film or an aluminum alloy film as a main conductive layer. It is formed through patterning by etching the aluminum film or aluminum alloy film already formed on the semiconductor substrate 2. On the wiring 7, a surface protective film (protective film) 12 made of, for example, an insulating films (protective film) 11 of silicon oxide etc. and an insulating film of silicon nitride etc. In Embodiment 1, as the protective film, a multilayered film of a silicon oxide film and a silicon nitride film are shown. However, the protective film is not limited to these. For example, the protective film can be formed by using a single-layer insulating film alone such as a silicon nitride film 12, or the like.

Moreover, parts of the above insulating films 11 and 12 are opened, being regions where the wirings 7 are exposed.

Part of the above wiring 7 is a region exposed through the above opening. The region where the wiring 7 is exposed is a region to serve as a bump coupling part (a second pad) 15 to which a bump electrode 13 is coupled, a bonding pad (a first pad) 16 to which a bonding wire 14 is coupled, and a testing pad 17 with which an inspection probe is brought into contact. As compared to regions of other wirings 7, its shape in a plane is wider.

The wirings 7 of the uppermost layer are electrically coupled with lower layer wirings 4, 5, and 6 in an input-output circuit forming region (a first circuit region) AIO arranged along a peripheral edge of the chip 1. The wiring 7 extends from the input-output circuit forming region AIO to a region (a second circuit region) relatively inside the chip 1 in a plane. Moreover, the bonding pad 16 and the testing pad 17 are arranged, in a plane, in their input-output circuit forming region AIO.

As shown in FIGS. 3 and 4, the wiring 7 which is to be a wiring for signaling is electrically coupled with the lower layer wirings 4, 5, and 6 in the input-output circuit forming region AIO. Through an input-output circuit (including the semiconductor element 3) and the wiring 4 formed in the input-output circuit forming region AIO, the wiring 7 is further electrically coupled to a logic (digital system) circuit formed inside the chip 1.

As shown in FIGS. 5 and 6, the wiring 7 serving as a wiring for a power supply/GND to be electrically coupled with a power supply potential or a reference potential is electrically coupled with the lower layer wirings 4, 5, and 6 in the input-output circuit forming region AIO. Then, through the wiring 4, it supplies electric power to a logic circuit formed inside the chip 1. The wirings 4, 5, and 6 for the power supply/GND to which the wiring 7 serving as the wiring for the power supply/GND is electrically coupled extend, as a plurality of wirings, in the same direction in the same wiring layer. Further, they extend in directions where the plurality of wirings of the same potential in one upper layer or lower layer cross with one another in a plane (hereinafter, referred to as a "mesh structure"). FIGS. 5 and 6 show examples where the wiring 7 is coupled with the wiring 6 of one-lower layer in the input-output circuit forming region AIO. In addition to the input-output circuit forming region AIO, however, the wiring 7 may be coupled to the wiring 6 at other places.

As shown in FIGS. 7 to 11, in Embodiment 1, the wiring 7 to be a wiring for the power supply/GND has a slit structure. By being coupled to lower layer wirings 6, the wirings 7 form a mesh wiring shown in FIG. 11. In addition, if the structure is such that the first wiring layer is a power-supply wiring, for example, and the second wiring layer is a GND wiring, it is clear that the mesh wiring can be achieved also with a single wiring layer. Even in regions (for example, a region A2) other than the input-output circuit forming region AIO, couplings with the lower layer wirings 6 are made at a plurality of places. In this region (a second circuit region) A2, the wirings (third wirings) 4, 5, and 6 formed in the wiring layer (a second wiring layer) one layer below the wiring 7 also have mesh structures.

Thus, by having the mesh structure and being coupled to the wirings of the upper and lower layers at a plurality of places, the wirings 4, 5, 6, and 7 being the wirings for the power supply/GND are capable of stably feeding electricity. Moreover, in the wiring 7 having the mesh structure in the region A2, a bump coupling part (a third pad) 15 may be provided, and a bump electrode 13 to be coupled may further be formed.

As shown in FIGS. 2 to 10, according to Embodiment 1, both in the case where the chip 1 is electrically coupled with an external circuit through the bump electrode 13 and in the case where the chip 1 is electrically coupled with an external circuit through the bonding wires 14, the bump coupling part 15 and the bonding pad 16 are both formed in the single wiring 7. However, the bump coupling part 15 and bonding pad 16 are not necessarily provided in all the wirings 7. There are some bonding pads 16 where the bump coupling parts 15 are not provided.

When the chip 1 is electrically coupled with an external circuit through the bump electrode 13, first, openings 18 reaching the bump coupling part 15 are formed in an insulating film 11 and a surface protective film 12 at locations where the bump electrodes 13 are formed. Further, surfaces of the bonding pad 16 and the testing pad 17 remain covered with the insulating film 11 and the surface protective film 12. When forming the bump electrode 13, the surfaces of the bonding pad 16 and the testing pad 17 are left covered with the insulating film 11 and the surface protective film 12. The reason is that it can prevent the bonding pad 16 and the testing pad 17 from being melted by a reflow heat of the solder to be used as the bump electrode 13.

On the other hand, when the chip 1 is electrically coupled with an external circuit through a bonding wire 14, first, in the insulating film 11 and surface protective film 12 on the bonding pad 16 and the testing pad 17, there are formed openings 19 and 20 which reach the bonding pad 16 and the testing pad 17, respectively. The surface of the bump coupling part 15 is left covered with the insulating film 11 and the surface protective film 12. When coupling the bonding wire 14, the surface of the bump coupling part 15 is left covered with the insulating film 11 and the surface protective film 12. The reason is that it can prevent the corrosion progressing from the bump coupling part 15.

Further, FIGS. 3, 5, 7, and 9 show opening locations 19A and 20A of respective openings 19 and 20 which are not actually formed. FIGS. 4, 6, 8, and 10 show an opening location 18A of an opening 18 which is not actually formed.

As described above, according to Embodiment 1, the chip 1 before formation of the wiring 7 of the uppermost layer can have the same layout both in the case where the chip 1 is electrically coupled to an external circuit through the bump electrode 13 and the case where the chip 1 is electrically coupled to an external circuit through the bonding wires 14. As a result, it is possible to form patterns by using the same mask both in the case where the chip 1 is electrically coupled with the external circuit through the bump electrode 13 and in the case where the chip 1 is electrically coupled with the external circuit through the bonding wires 14 until the wiring 7 of the uppermost layer is formed. Therefore, the process can be shared. As a result, mass production efficiency of the semiconductor device of the Embodiment 1 is improved, reducing the manufacturing cost.

Layout verification of the openings 18, 19, and 20 is performed as follows. That is, the opening 18 and the openings 19 and 20 are allowed to belong to different layers (data types may be switched) and the verification may be performed by preparing layout verification rules suitable for respective layers. In addition, with respect to the layout verification of the openings 18, 19, and 20, by allowing the case where the bonding wire is used and the case where the bump electrode is used to have different data types or layers of the openings, the designer may selectively use layout verification rules for the openings 18, 19, and 20 properly with the same rule file, and may choose and use the layer.

Moreover, when preparing masks for the openings 18, 19, and 20, an MPD (Mask Pattern Data Specification), which is a data file for supporting mask preparation, is used. The layer of the opening 18 is assigned in using the bump electrode 13, the layer of the openings 19 and 20 is assigned in using the bonding wire 14, and masks for exclusive use are created, respectively. By adopting a process method at such a wafer level, it is possible to switch methods to prepare the chip 1 when using the bump electrode 13 and when using the bonding wire 14.

As for the pattern transfer process of the openings 18, 19, and 20, masks may not be prepared and direct writing by using an electronic beam may be performed. Thereby, the cost for preparing masks can be reduced. Moreover, with respect to the wiring pattern of the layer lower than the wiring 7, the direct wiring method by use of the electronic beam may be adopted.

Next, with reference to FIGS. 12 to 15, the manufacturing process of the chip 1 of Embodiment 1 will be explained. As described above, the process until the formation of the wiring 7 is the same both in the case of using the bump electrode 13 and in the case of using the bonding wire 14.

Figure 12:
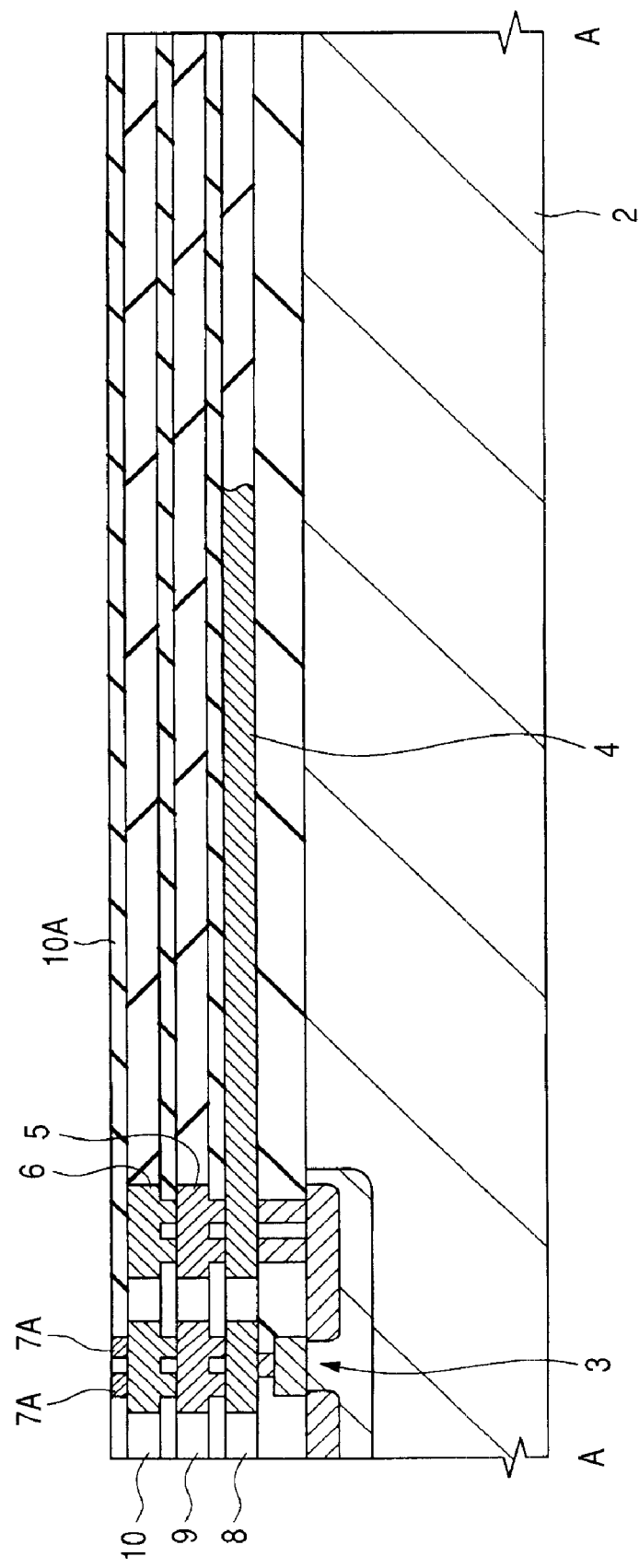
FIG. 12 is a sectional view of an essential part illustrating a manufacturing process of a semiconductor device according to an embodiment of the present invention.

First, as shown in FIG. 12, on the semiconductor substrate 2 in which a semiconductor element 3 for forming an integrated circuit and the wirings 4 to 6 are formed, silicon oxide films, for example, are stacked and an interlayer dielectric film 10A is formed.

Then, using a photo-resist film patterned by a photolithography technique as a mask, the interlayer dielectric film 10A is etched, and a contact hole reaching the wiring 6 is formed.

Subsequently, on the interlayer dielectric film 10A including the inside of the contact hole, a thin titanium film, a single layer film of a titanium nitride film, or a multilayered film of these films are deposited to form a barrier conductive film. Then, a tungsten film is deposited on the interlayer dielectric film 10A, and the contact hole is filled with the tungsten film. Subsequently, plugs 7A to be coupled to the wiring 6 are formed by removing the barrier conductive film and tungsten film outside the contact hole.

Figure 13:
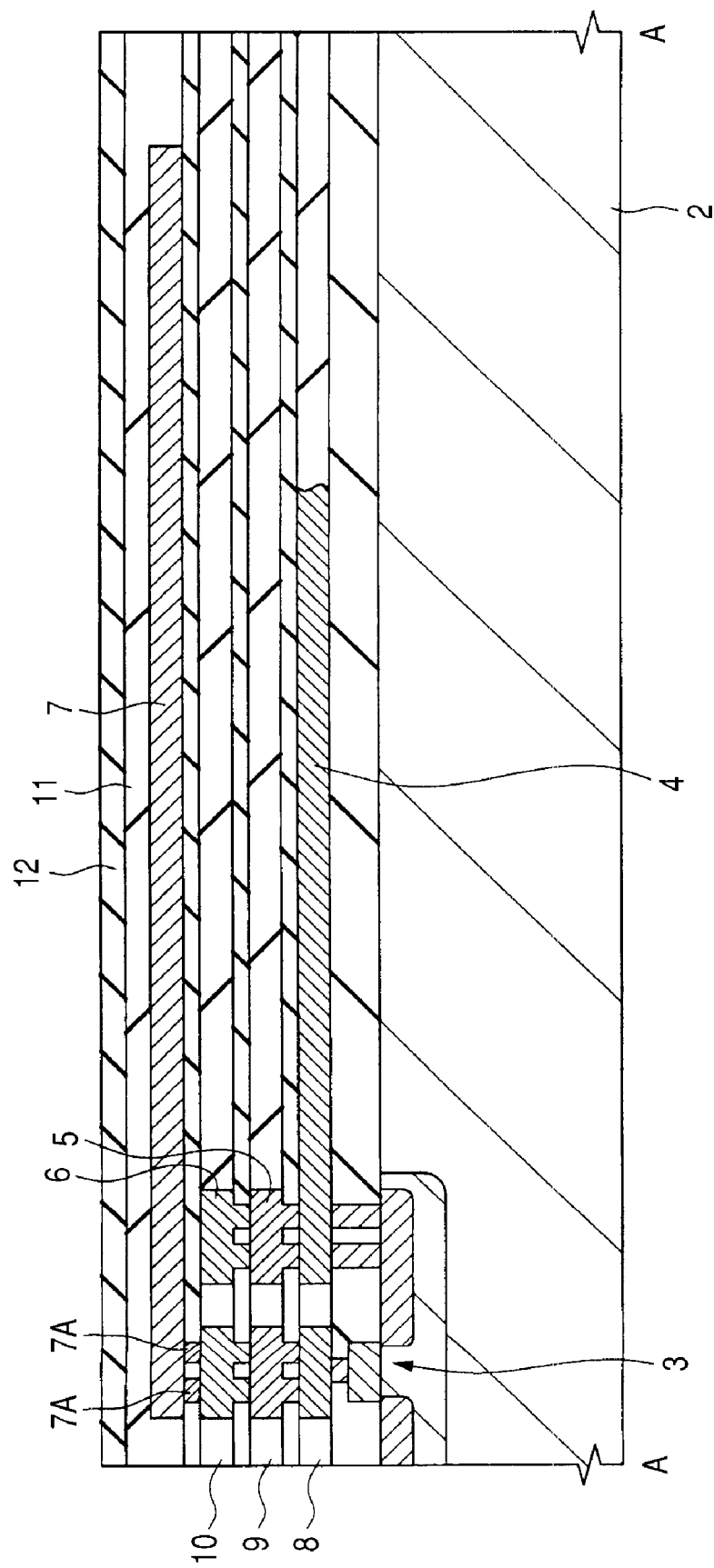
FIG. 13 is a sectional view of an essential part of the semiconductor device during a manufacturing process subsequent to the process in FIG. 12.

Next, as shown in FIG. 13, on the semiconductor substrate 2, a titanium film, an aluminum film (or an aluminum alloy film), and a titanium nitride film are deposited sequentially. Then, those titanium film, aluminum film (or the aluminum alloy film), and the titanium nitride film are patterned by dry etching which uses the photo-resist film as a mask, and the wiring 7 is formed. As described above, in this process, the bump coupling part 15, bonding pad 16, and testing pad 17 are formed and defined.

Then, on the semiconductor substrate 1, a silicon oxide film and a silicon nitride film are deposited sequentially to form the insulating film 11 and a surface protective film 12.

The following processes differ in the case of using the bump electrode 13 and in the case of using the bonding wire 14.

Figure 14:
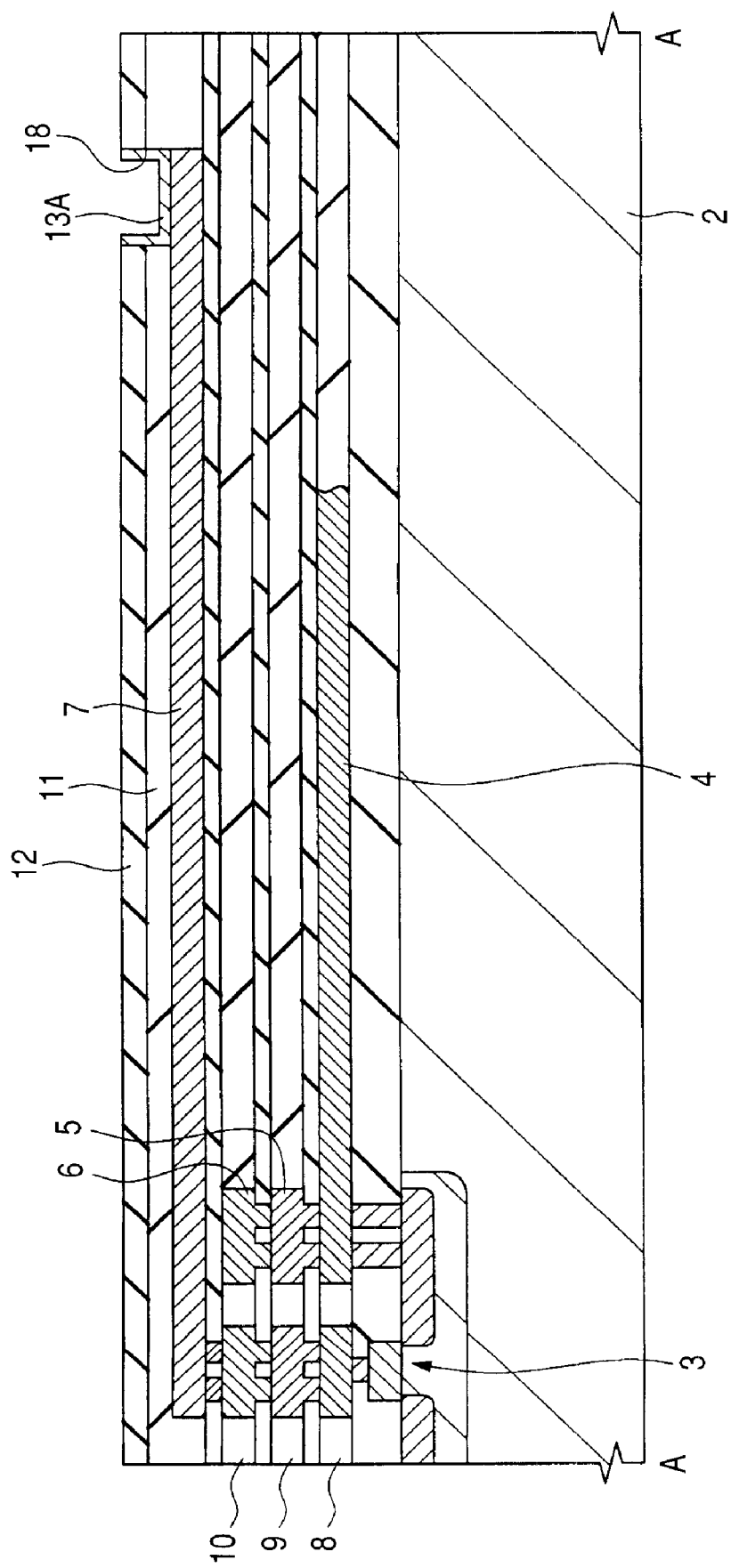
FIG. 14 is a sectional view of an essential part of the semiconductor device during a manufacturing process subsequent to the process in FIG. 13.

When using the bump electrode 13, as shown in FIG. 14, with use of the photo-resist film patterned by the photolithography technique as a mask, the surface protective film 12 and the insulating film 11 are etched, and an opening 18 reaching the wiring 7 is formed. Then, for example, by a chemical-plating method, on the wiring 7 under the opening 18, a conductive film such as a gold film is formed, and a ground film 13A for the bump electrodes is formed.

Next, the bump electrode 13 is formed. For example, a manufacturing process of the bump electrode 13 is performed as follows. First, a solder paste is printed on the semiconductor substrate 2 by a solder printing technique. Then, by a reflow treatment, the solder paste is melted and re-crystallized. Thus, the bump electrode 13 is formed on the ground film 13A for the bump electrodes (see FIGS. 3, 5, 7, and 9). As the solder paste, for example, lead-free solder made of tin, silver, and copper may be used. Moreover, instead of using the solder paste, the bump electrode 13 can also be formed by applying a reflow treatment to the semiconductor substrate 2 after supplying a solder ball spherically formed in advance on the opening 18.

After that, the semiconductor substrate 2 in wafer form is cut along a scribe (dicing) area between the partitioned chip areas, and is divided into individual chips 1. The divided chips 1 can be mounted on a mounting substrate through the bump electrode 13. After arranging the chips 1 on the mounting substrate, the reflow of the bump electrode 13 is carried out. subsequently, an under-fill resin is filled between the chip 1 and the mounting substrate to manufacture the semiconductor device of Embodiment 1.

Figure 15:
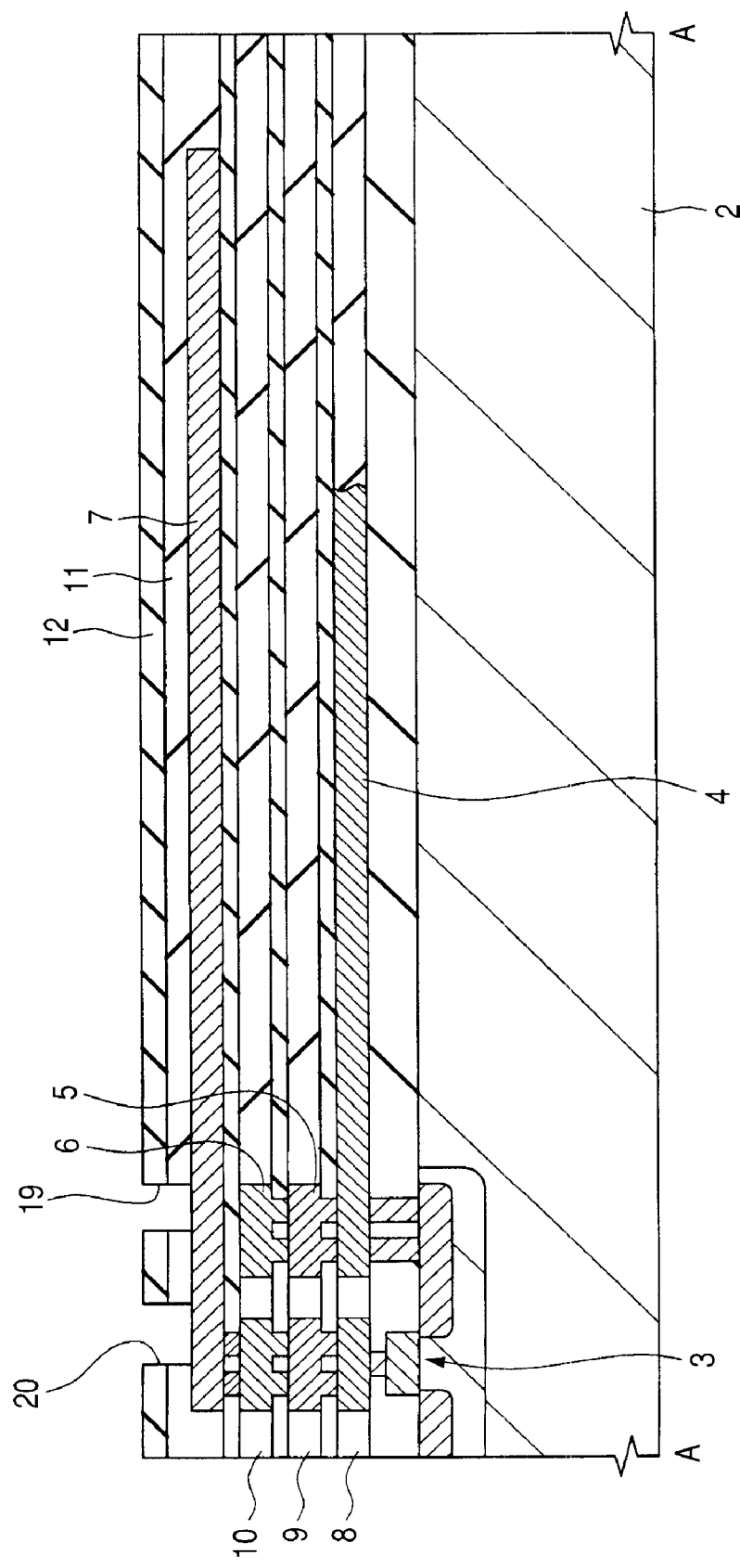
FIG. 15 is a sectional view of an essential part of the semiconductor device during a manufacturing process subsequent to the process in FIG. 13.

When using the bonding wire 14, as shown in FIG. 15, with use of the photo-resist film patterned by a photolithography technique as a mask, the surface protective film 12 and the insulating film 11 are etched. Then, in the input-output circuit forming region AIO, openings 19 and 20 reaching the wiring 7 are formed.

Next, a wafer test is performed on a testing pad 17 by using a probe. The test by the probe is performed by bringing a needle of the probe into direct contact with the testing pad 17. If the test is carried out by using a bonding pad 16 for actually forming a bonding wire 14, there may occur a problem such as a crack in the interlayer dielectric film under the bonding pad 16 due to stress caused by the probe needle. Therefore, in Embodiment 1, a region of the testing pad 17 for the test by the probe and a region of the bonding pad 16 for actually forming the bonding wire 14 are formed separately.

Next, the semiconductor substrate 2 in wafer form is cut along a scribe (dicing) area between partitioned chip areas and is divided into individual chips 1. The divided chips 1 are mounted on a mounting substrate (for example, a multilayer wiring board) by use of a DAF (Die Attached Film), or the like. Then, the bonding pad 16 under the opening 19A is coupled with an electrode of the mounting substrate using the bonding wire 14 (see FIGS. 4, 6, 8, and 10). Subsequently, the chip 1 and the bonding wires 14 are sealed with a mold resin. Then, the mold resin and the mounting substrate are cut at predetermined positions, and the semiconductor device of Embodiment 1 is manufactured.

Figure 16:
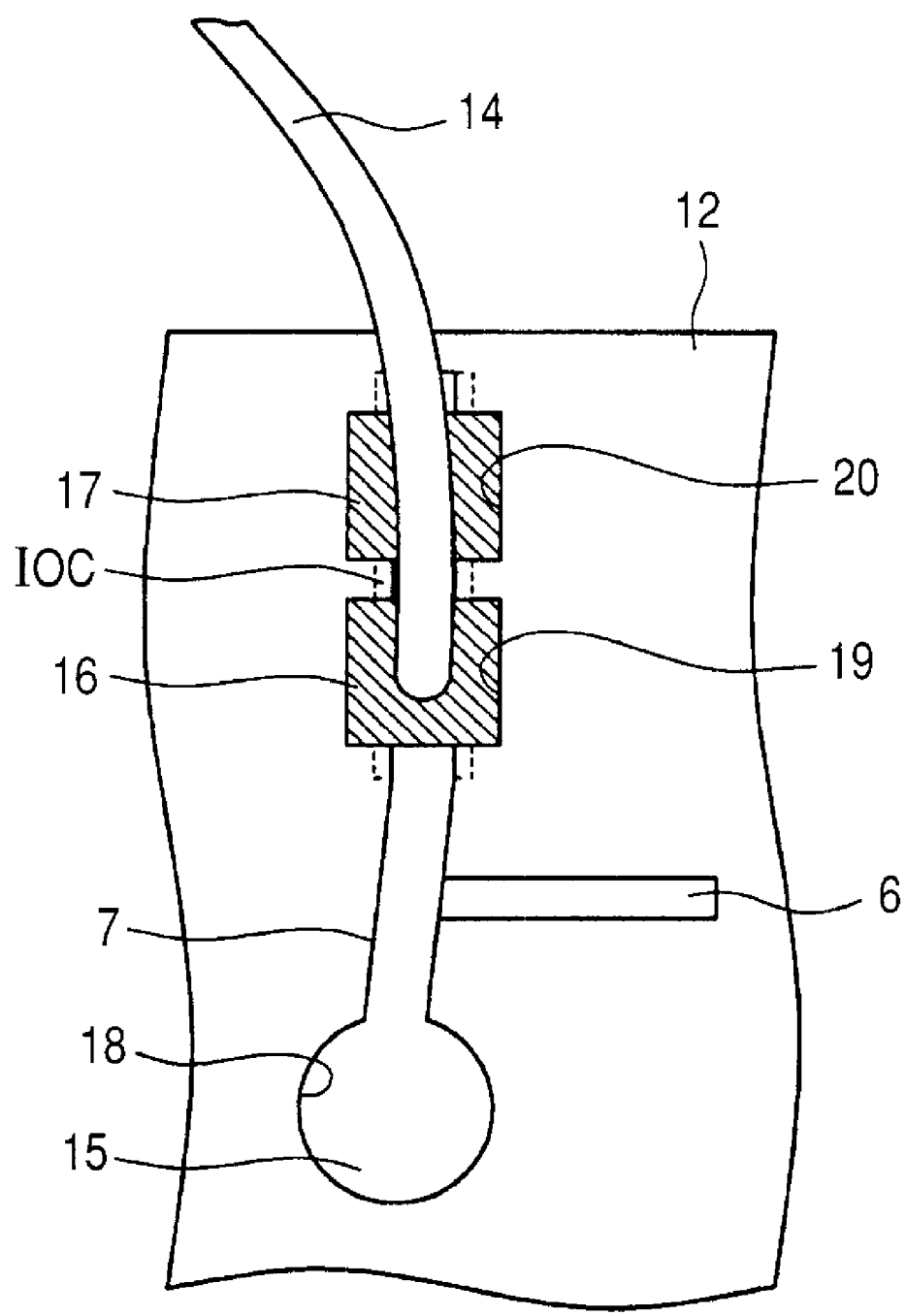
FIG. 16 is a plan view of an essential part of a chip included in a semiconductor device according to an embodiment of the present invention.
Figure 17:
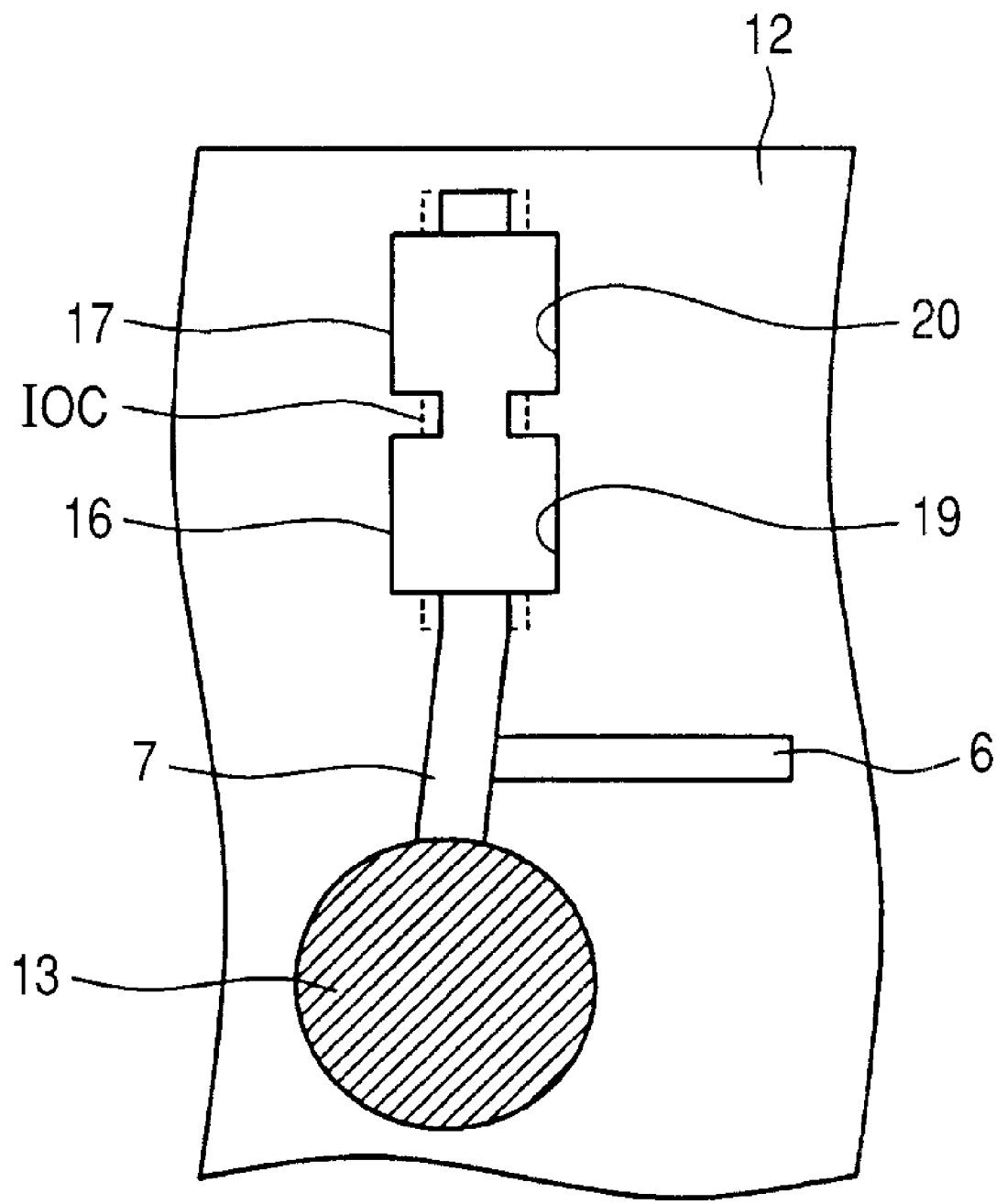
FIG. 17 is a plan view of an essential part of a chip included in a semiconductor device according to an embodiment of the present invention.

In this regard, FIGS. 16 and 17 are plan views for showing essential parts near the bump coupling part 15 (or the bump electrode 13), the bonding pad 16, and the testing pad 17 in the chip 1. FIG. 16 is the plan view of the case of using the bonding wire 14, and FIG. 17 shows the case where the bump electrode 13 is used. As described above, the bonding pad 16 and the testing pad 17 are arranged in the input-output circuit forming region AIO. Below the bonding pad 16 and the testing pad 17, there is formed an input-output circuit cell IOC including the input-output circuit.

Figure 18:
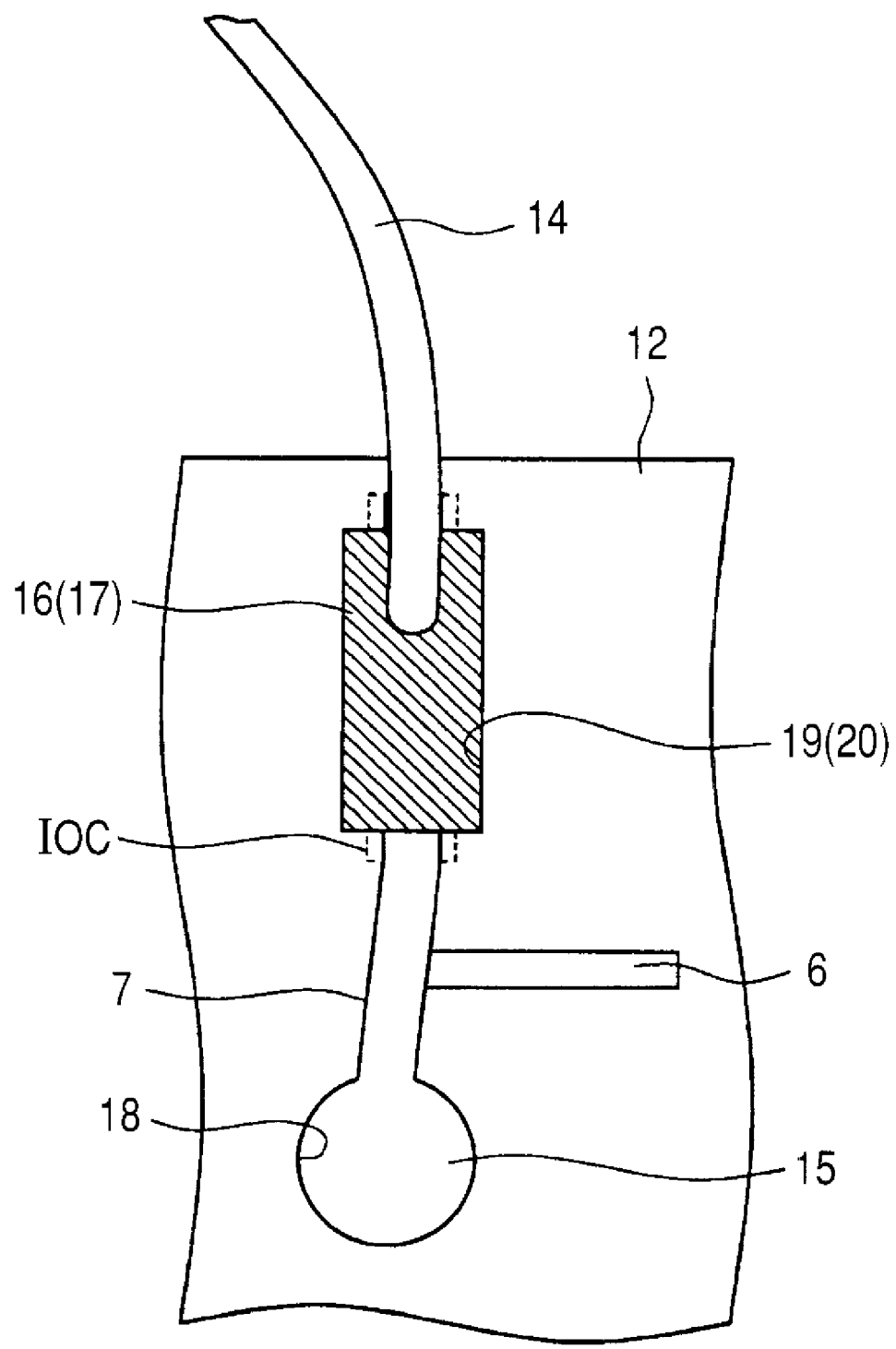
FIG. 18 is a plan view of an essential part pf a chip included in a semiconductor device according to an embodiment of the present invention.
Figure 19:
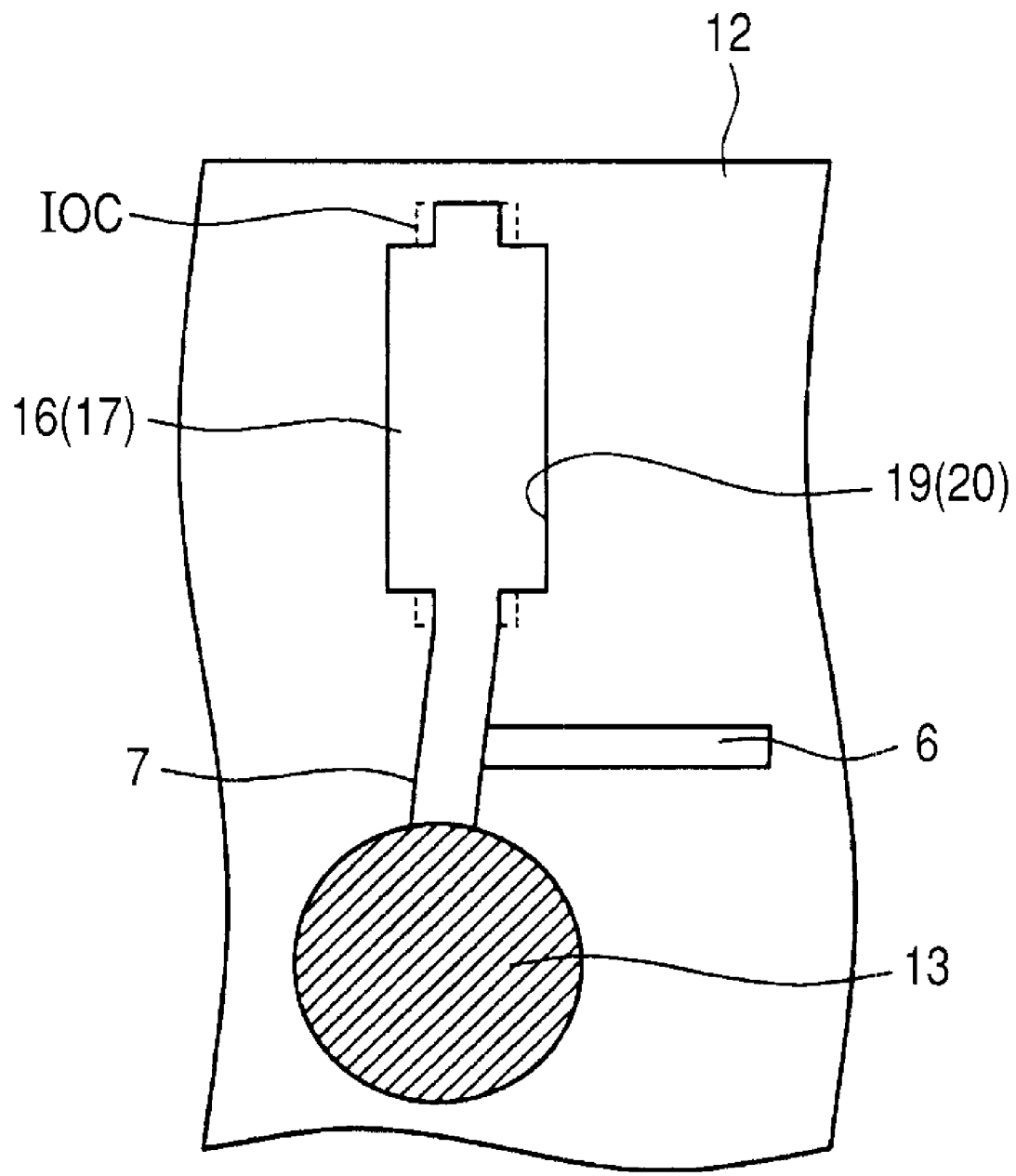
FIG. 19 is a plan view of an essential part of a chip included in a semiconductor device according to an embodiment of the present invention.

So far, in Embodiment 1, the explanation has been directed to the case where the bonding pad 16 and the testing pad 17 are arranged separately. As shown in FIGS. 18 and 19, however, the structure may be the one whose size in a plane is large where the bonding pad 16 and the testing pad 17 are integrally formed. Alternatively, the testing pad 17 itself may be eliminated from the structure.

Also, as for the wiring 7 of the uppermost layer, the configuration in which aluminum is a main ingredient has been described. However, it is evident that the similar effects can be obtained even if other materials such as copper etc. are used. Alternatively, the wiring 7 of the uppermost layer alone may be made of aluminum, and the wiring layers lower than that may be the one mainly made of copper. Now, a case where the wiring 6 is formed on the interlayer dielectric film 10 will be described. First, the interlayer dielectric film 10 is formed. Then, a hole for coupling to the lower layer wiring 5 is formed. After that, a wiring groove being part of the wiring 6 is formed. Next, in the hole and groove, a barrier metal film made of conductive films such as tantalum, tantalum nitride, etc. are formed. Further, on the barrier metal film, a conductive film (copper film) whose main ingredient is copper is formed. Then, by removing the barrier metal film and copper film outside the groove by a CMP method etc., the barrier metal film and copper film are embedded in the hole and groove. Thus, the wiring 6 and a coupling part for coupling the wiring 6 with wiring 5 can be formed.

In Embodiment 1, when electrically coupling the chip 1 with external chips such as a memory circuit etc., with the bonding wire 14 used and, for example, the bonding pad 16 (wiring 7) arranged in the region A3 (see FIG. 1) serves as an interface for being electrically coupled to the memory circuit. On the other hand, when there is no need to electrically couple the chip 1 with the external memory circuit, the bump electrode 13 is used. The size of the chip 1 can be reduced by, for example, not forming the bump electrode 13 on the wiring 7 to be provided in the region A3 for electrically coupling with the external memory circuit. Therefore, in the region A3 being an interface for electrically coupling with the external memory circuit, for example, there are fifty-one bonding pads 16 and ten bump electrodes 13. That is, in Embodiment 1, the number of bonding pads 16 formed on the chip 1 is larger than the number of bump coupling part 15.

When the bump electrodes 13 are used, the wiring 7 of the region A3 being the interface for electrically coupling with the memory circuit has an open end. With respect to such a wiring 7, processing such as pulling up or pulling down may be given. That is, it is necessary to design such that, even if an open end is formed, it may not interfere with an operation of the logic circuit formed in the chip 1.

Figure 20:
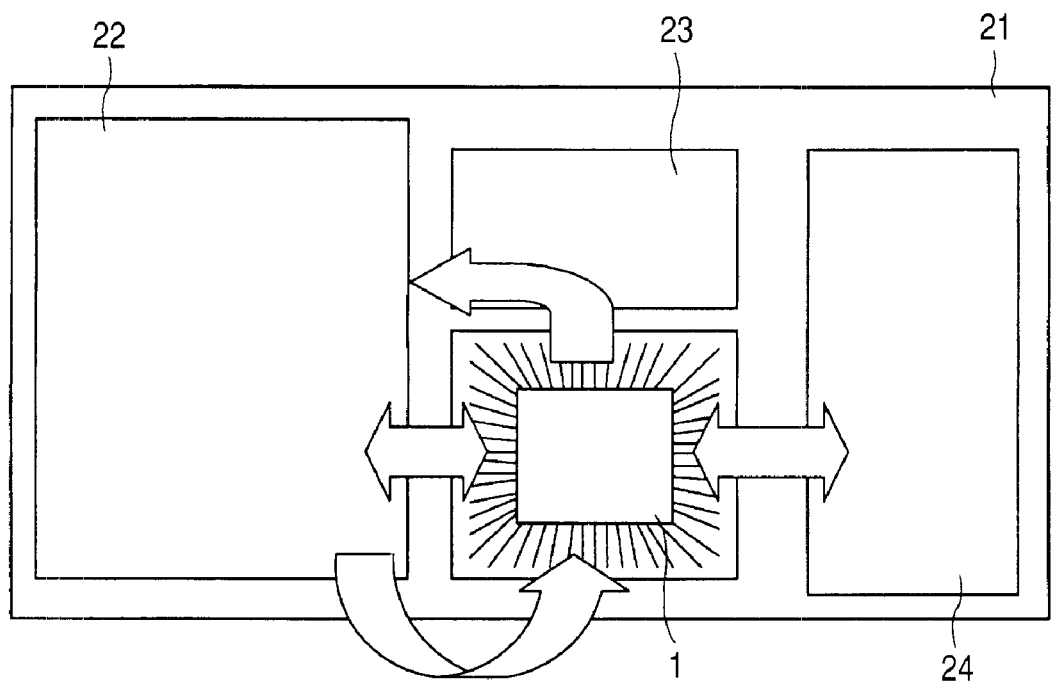
FIG. 20 is a plan view of a semiconductor device according to an embodiment of the present invention.
Figure 21:
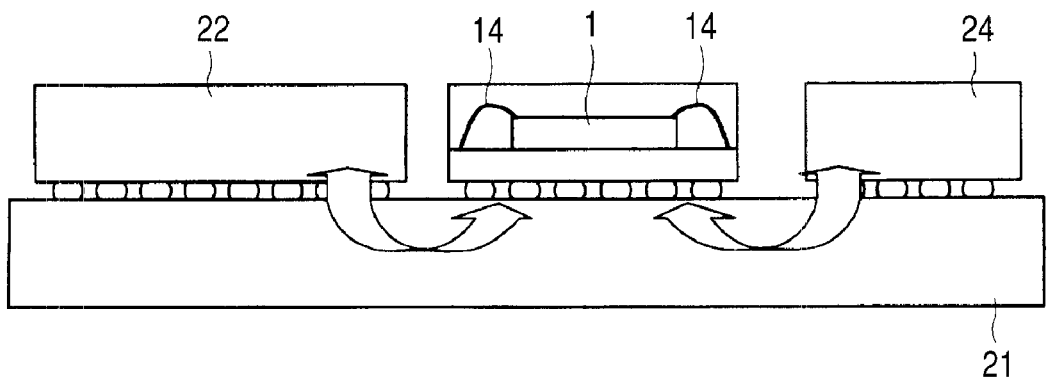
FIG. 21 is a side view of a semiconductor device according to an embodiment of the present invention.
Figure 22:
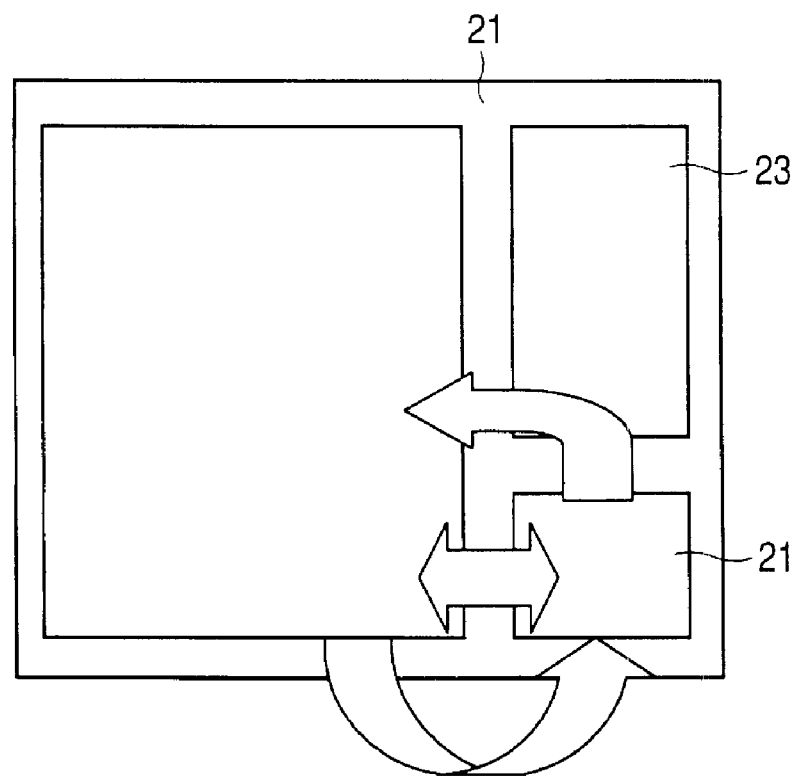
FIG. 22 is a plan view of a semiconductor device according to an embodiment of the present invention.
Figure 23:
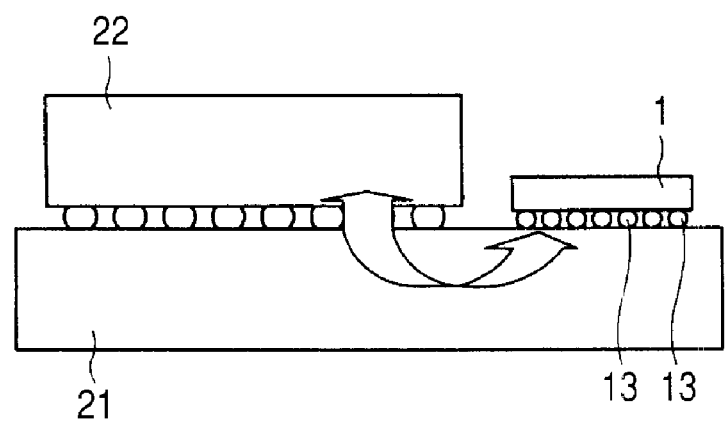
FIG. 23 is a side view of a semiconductor device according to an embodiment of the present invention.

FIGS. 20 to 23 show examples of the case where the chip 1 of Embodiment 1 is mounted, as a controller of a wireless system, on a module substrate 21. FIGS. 20 and 21 are a plan view and a side view of the cases of using the above bonding wires 14, respectively. FIGS. 22 and 23 are a plan view and a side view of the cases of using the bump electrodes 13, respectively. On the module substrate 21, there are formed, other than the chip 1, an RF chip 22 in which an RF (Radio Frequency) circuit for performing a high frequency operation is formed, a by-pass capacitor chip 23, or the like. The by-pass capacitor chip 23 is electrically inserted into a power supply line for stabilizing the power supply. Further, the arrows in FIGS. 20 to 23 show the flow of signals between chips.

As described above, when the chip 1 using the bonding wire 14 is mounted on the module substrate 21, the memory chip 24 in which the memory circuit is formed can also be mounted on the module substrate 21 (see FIGS. 20 and 21).

As a result, since numbers of programs such as firmware can be mounted, it becomes possible to raise the functionality of the whole wireless system.

On the other hand, when the chip 1 using the bump electrodes 13 is mounted, the memory chip 24 is not mounted. Therefore, it becomes possible to build a wireless system of a minimum configuration (see FIGS. 22 and 23). As a result, it becomes possible to minimize the size of the module in which the wireless system is built. Therefore, the wireless system can be applied also to a device such as a cellular phone in which a mounting region for the module is limited.

Embodiment 2

Figure 24:
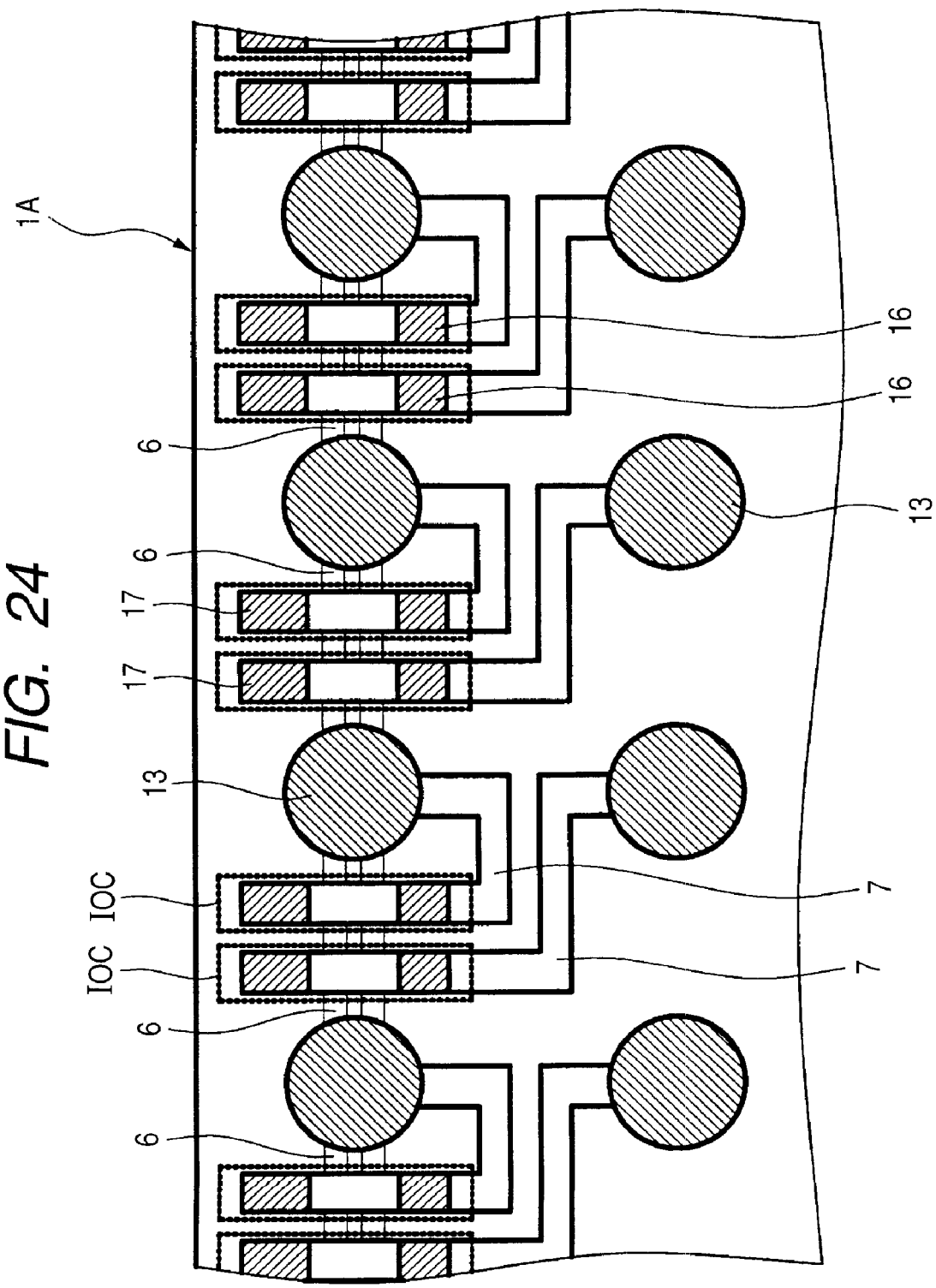
FIG. 24 is a plan view of an essential part of a chip included in a semiconductor device according to another embodiment of the present invention.

FIG. 24 is a plan view showing an essential part of the chip 1 of Embodiment 2. FIG. 24 shows a region corresponding to the region A4 in FIG. 1 shown in Embodiment 1.

As shown in FIG. 24, an input-output circuit cell IOC is formed in the region A4 which is relatively close to the peripheral edge 1A of the chip 1 and along the peripheral edge 1A. On the input-output circuit cell IOC, there are provided the bonding pad 16 and testing pad 17 described in Embodiment 1.

As shown in FIG. 2 and also described in Embodiment 1, the bump coupling part 15, the bonding pad 16, and the testing pad 17 also are formed on the single wiring 7. Since the bonding pad 16 and the testing pad 17 are formed on the input-output circuit cell IOC, the wiring 7 is pulled around to a region where the bump electrode 13 does not overlap on the input-output circuit cell IOC in a plane, that is, relatively toward the center of the chip 1, and the bump coupling part 15 is arranged.

In this regard, as shown in FIG. 24, in the region A4, when it is possible to design a layout of the input-output circuit cell IOC such that a space can be secured for arranging the bump electrode 13 between the neighboring two input-output circuit cells IOC, such a layout of the input-output circuit cells IOC is adopted. Then, the wiring 7 is pulled around to the space between the input-output circuit cells IOC, and the bump coupling part 15 and the bump electrode 13 are arranged. As a result, it becomes unnecessary to secure a region toward relatively the center of the chip 1 where the bump electrode 13 is arranged. Thus, the area of the chip 1 is reduced and the chip 1 can be made compact. In particular, such a region A4 can be effectively used when it is close to an analogue system circuit region A6 shown in FIG. 1. This is because, as compared to regions where other logic system circuits are formed, the analogue system circuit region A6 has few cases where signal lines or power supply lines are taken in, and the number of the input-output circuit cells IOC can be small.

Also in other regions like the region A3, when the number of the input-output circuit cells IOC can be small, the bump electrodes 13 can be arranged between two neighboring input-output circuit cells IOC.

Figure 25:
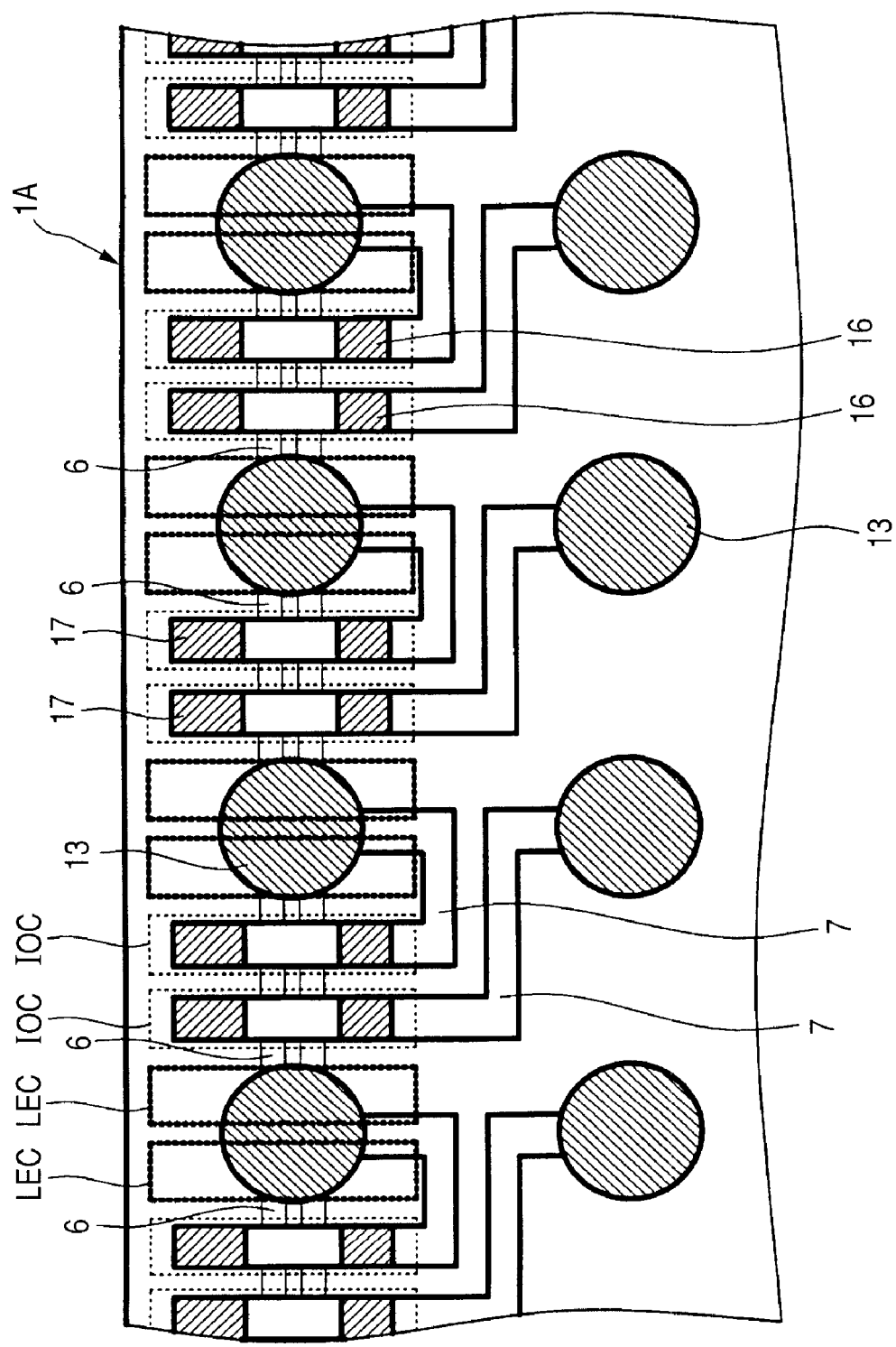
FIG. 25 is a plan view of an essential part of a chip included in a semiconductor device according to another embodiment of the present invention.

Moreover, as shown in FIG. 25, in order to effectively use a space under the bump electrodes 13 arranged in the space between the input-output circuit cells IOC, there may be formed, for example, an ordinary logic (digital system) circuit or a protection circuit containing diodes for preventing electrostatic discharge (ESD) under the bump electrodes 13 arranged in the space between the input-output circuit cells IOC. As a result, by providing an additional circuit function to the chip 1 or by further reducing the area of the chip 1, it becomes possible to make the chip 1 more compact.

Also in the region A5 (see FIG. 1) relatively close to the peripheral edge 1A of the chip 1 and along the peripheral edge 1A, the input-output circuit cell IOC is arranged according to a layout similar to the one in the region A4. Then, the wiring 7 is pulled around to a space between the input-output circuit cells IOC, and the bump coupling part 15 and the bump electrodes 13 are arranged.

Incidentally, in Embodiment 2, the region A5 is a narrow region between the peripheral edge 1A of the chip 1 and a region (a third circuit region) A6 where the bump electrode 13 cannot be arranged in terms of designing. Furthermore, it is a region with restrictions when arranging the bump electrodes 13 where the bump electrodes 13 must be arranged a predetermined distance T1 or more away from the peripheral edge 1A of the chip 1. In addition, the region A6 is located on a side relatively inner of the chip 1 than the region A5 and, for example, an analogue system circuit is formed there. If the wiring 7 or the bump electrode 13 is formed on the analogue system circuit region A6, there may occur a noise from the wiring 7 or parasitic capacitance. As compared to other logic circuits, the analogue system circuit region A6 is more sensitive to the noise and parasitic capacitance. Therefore, it is the region where the above restrictions are particularly severe.

Figure 26:
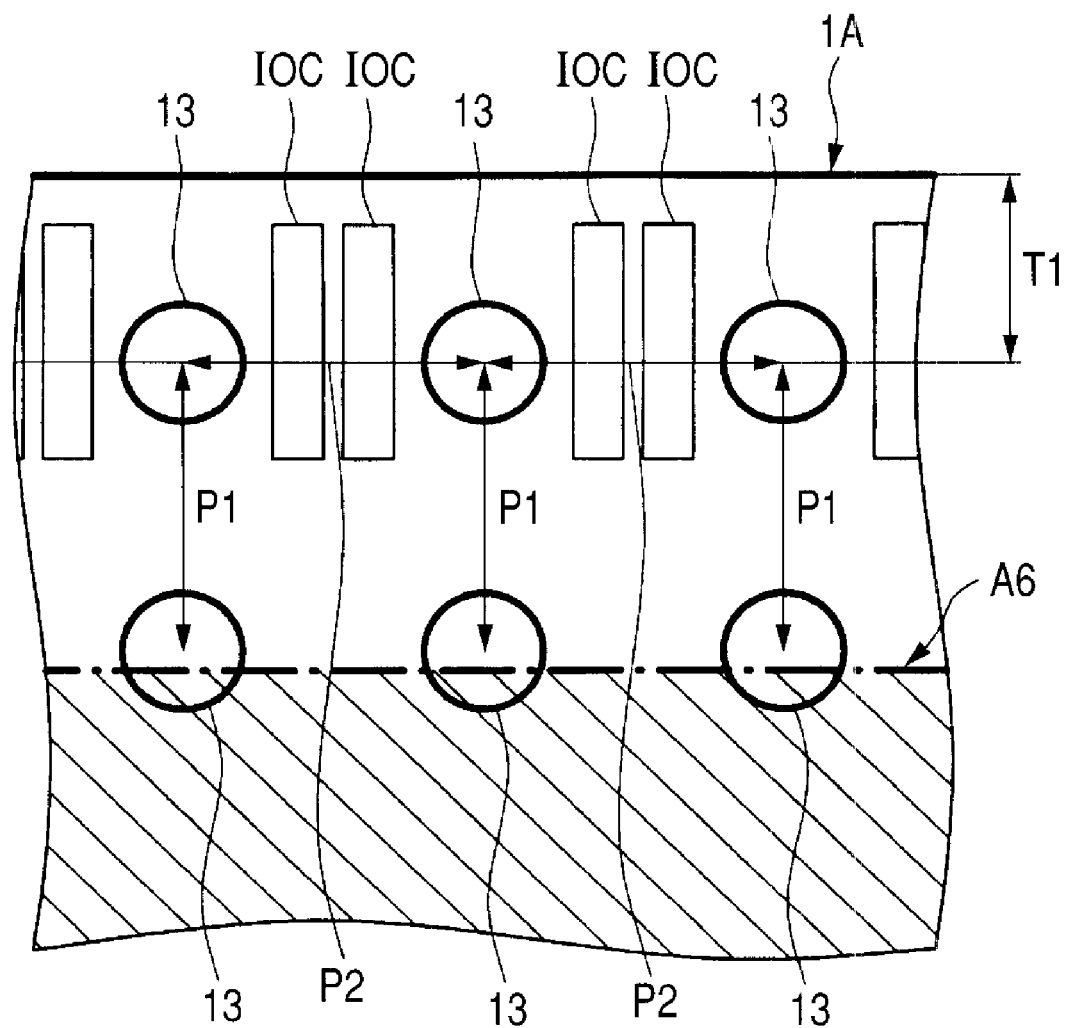
FIG. 26 is a plan view of an essential part of a chip compared to the chip included in the semiconductor device according to another embodiment of the present invention.

As shown in FIG. 26, in such a region A5, suppose there are arranged the bump electrodes 13 positioned relatively close to the peripheral edge 1A of the chip 1 and the bump electrodes 13 positioned relatively close to the region A6 in a direction orthogonal to the peripheral edge 1A of the chip 1 with a pitch P1. In such a case, even if the pitch P1 is the same as a positioning pitch P2 of the bump electrodes 13 positioned relatively close to the peripheral edge 1A of the chip 1, the bump electrodes 13 positioned relatively close to the region A6 may enter the region A6 where the bump electrodes 13 should not be positioned.

Figure 27:
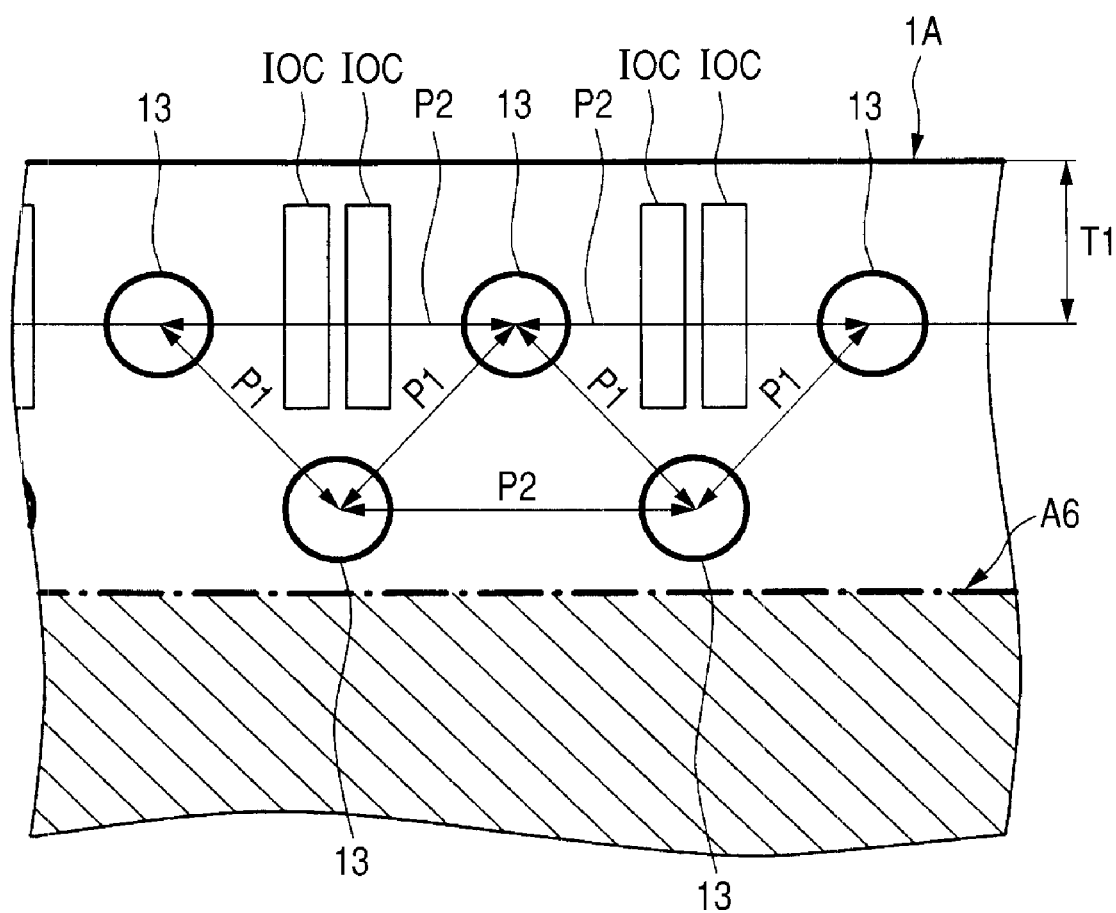
FIG. 27 is a plan view of an essential part of a chip compared to the chip included in the semiconductor device according to another embodiment of the present invention.

Further, as shown in FIG. 27, suppose there are arranged two bump electrodes (or one bump electrode) 13 positioned relatively close to the peripheral edge 1A of the chip 1 and one bump electrode (or two bump electrodes) 13 positioned relatively close to the region A6 such that an isosceles triangle is formed by coupling them which serve as vertexes and that the bump electrodes 13 are prevented from overlapping on the region A6. In such a case, the positioning pitch P2 of the bump electrodes 13 in the direction along the peripheral edge 1A of the chip 1 is widened. Therefore, when arranging the desired number of bump electrodes 13, the size of the chip 1 may be increased. Further, in FIG. 27, P1 represents a pitch distance between the bump electrode 13 positioned relatively close to the peripheral edge 1A of the chip 1 and the bump electrode 13 positioned relatively close to the neighboring region A6.

Figure 28:
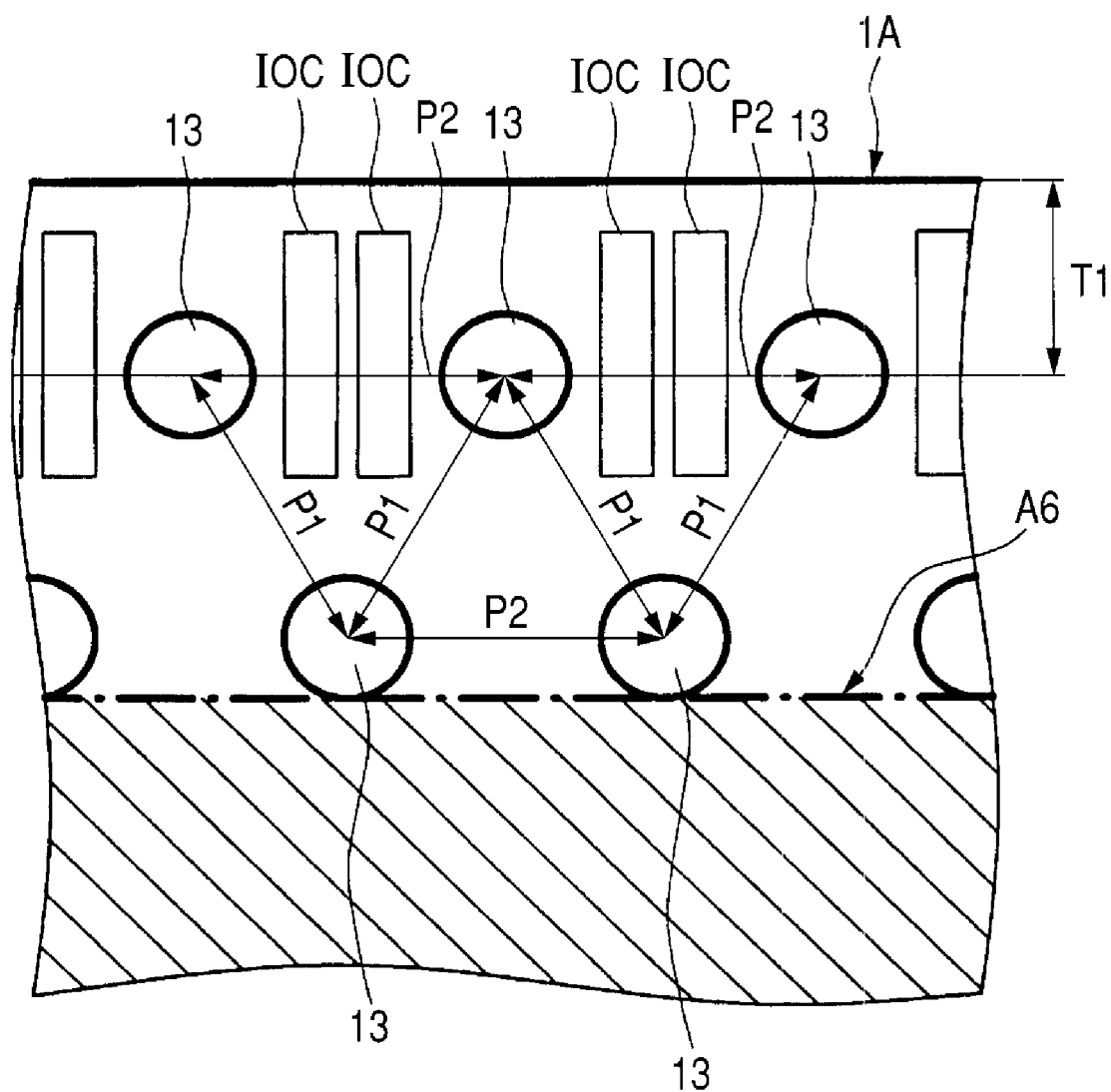
FIG. 28 is a plan view of an essential part of a chip included in a semiconductor device according to another embodiment of the present invention.

Therefore, in Embodiment 2, as shown in FIG. 28, there are arranged two bump electrodes (or one bump electrode) 13 positioned relatively close to the peripheral edge 1A of the chip 1 and one bump electrode (or two bump electrodes) 13 positioned relatively close to the region A6 such that an equilateral triangle is formed by coupling them which serve as vertexes thereof. Namely, the bump electrodes 13 are arranged such that an equilateral triangle is formed by coupling centers of the bump electrodes 13 as vertexes. Accordingly, as compared to the arrangement method of the bump electrodes 13 with the centers thereof serving as vertexes of an isosceles triangle, as shown in FIG. 27, it becomes possible to arrange a desired number of bump electrodes 13 in a small region. Thus, the size of the chip 1 is prevented from being increased, and it becomes possible to maintain or reduce the size of the chip 1.

Although the present invention made by the inventors has been specifically explained in conjunction with the above mentioned embodiments, it is needless to say that the present invention is not limited to the above mentioned embodiments and various modifications can be made without departing from the gist of the present invention.

The semiconductor device and the method of manufacturing the same of the present invention are widely applicable to semiconductor devices having the structure in which chips are mounted through bonding wires or bump electrodes.

What is claimed is:

1. A method of manufacturing a semiconductor device, comprising the steps of:
   (a) forming an integrated circuit in each of a plurality of chip areas over a semiconductor substrate partitioned into the chip areas by a scribe area;
   (b) forming, in an upper layer of said integrated circuit, a first wiring extending from a first circuit region to a second circuit region;
   (c) defining part of said first wiring of said first circuit region as a first pad and defining part of said first wiring of said second circuit region as a second pad;
   (d) forming a protective film over said semiconductor substrate under the presence of said first wiring;
   (e) forming a first opening in said protective film over said first pad or forming a second opening in said protective film over said second pad;
   (f) cutting said semiconductor substrate along said scribe area and dividing said semiconductor substrate into individual semiconductor chips; and
   (g) mounting each said semiconductor chip over a corresponding mounting substrate and, through a first bonding wire or a first bump electrode thereof, electrically coupling each semiconductor chip with said corresponding mounting substrate,
   wherein, in said step (g), if electrically coupling a semiconductor chip with said mounting substrate through said first bonding wire, said first opening is formed in said protective film over said first pad in said step (e) and said first bonding wire is coupled to said first pad in said step (g),
   wherein, if electrically coupling a semiconductor chip with said mounting substrate in said step (g) through said first bump electrode, said second opening is formed in said protective film over said second pad in said step (e), said first bump electrode being coupled to said second pad, and
   wherein said first wiring is electrically coupled to a power supply potential or a reference potential.

2. A method of manufacturing a semiconductor device according to claim 1,
   wherein each semiconductor chip is electrically coupled, through said first bump electrode thereof, to its corresponding mounting substrate,
   wherein, in said step (b), in a first wiring layer where said first wiring is formed, a second wiring is formed,
   wherein, in said step (c), part of said second wiring is defined as a third pad,
   wherein, in said step (e), a third opening is formed in said protective film over said third pad, and
   wherein a second bump electrode, which is coupled to said third pad, is formed over said third pad.

3. A method of manufacturing a semiconductor device according to claim 2,
   wherein, in said step (a), a plurality of third wirings respectively electrically coupled to said first wiring and said second wiring and extending in parallel to each other are formed in a second wiring layer lower than said first wiring layer, and
   wherein said second wiring and said plurality of third wirings are formed in said second circuit region, which is arranged at a center portion of said semiconductor chip.

4. A method of manufacturing a semiconductor device according to claim 1,
   wherein each of a plurality of said semiconductor chips is electrically coupled to its corresponding mounting substrate through said first bump electrode thereof,
   wherein said first circuit region includes input-output circuits arranged along a peripheral edge of said semiconductor chip, and
   wherein said second circuit region includes portions arranged between adjacent input-output circuits of said first circuit region.

5. A method of manufacturing a semiconductor device according to claim 4, wherein, in said second circuit region, a first circuit including a digital system circuit or a semiconductor element for preventing ESD is formed.

6. A method of manufacturing a semiconductor device according to claim 1, wherein said first pad is one of a number of said first pads, and said second pad is one of a number of said second pads, the number of said first pads being larger than the number of said second pads.

7. A method of manufacturing a semiconductor device according to claim 6,
   wherein a plurality of said first wirings is formed in said step (b),
   wherein part of said first wirings is adapted to serve as an interface with a memory chip,
   wherein said semiconductor chip in step (g) is used with or without said memory chip mounted to the corresponding mounting substrate,
   wherein, when used with said memory chip mounted to the corresponding mounting substrate, said semiconductor chip is electrically coupled with said corresponding mounting substrate, and said interface is electrically coupled to said memory chip,
   wherein, when used without said memory chip mounted to the corresponding mounting substrate, said semiconductor chip is electrically coupled to said corresponding mounting substrate through said corresponding first bump electrode, and
   wherein said second pad is not defined in said interface in said step (c).

8. A method of manufacturing a semiconductor device according to claim 1, wherein said first circuit region, said second circuit region, said integrated circuit, and said first wiring are formed using a same layout for each semiconductor chip.

9. A method of manufacturing a semiconductor device according to claim 1,
   wherein the first circuit region includes a plurality of input-output circuits arranged along a peripheral edge of said semiconductor chip,
   wherein the second circuit region has a first portion arranged between adjacent input-output circuits and a second portion arranged closer to a center of said semiconductor chip than the input-output circuits and the first portion of the second circuit region, and
   wherein said semiconductor chip includes a plurality of said first bump electrodes arranged in the first portion of the second circuit region and a plurality of said first bump electrodes arranged in the second portion of the second circuit region, said pluralities of said first bump electrodes being arranged in two lines parallel to the peripheral edge of said semiconductor chip at positions defining vertices of contiguous equilateral triangles.

10. A method of manufacturing a semiconductor device, comprising the steps of:
   (a) forming a plurality of first wirings over a semiconductor substrate;
   (b) forming a first insulating film over said first wirings; and
   (c) forming openings in said first insulating film so as to expose respective portions of said first wirings,
   wherein, in said step (a), each of said first wirings has a first region for connection of a respective bonding wire and a second region for connection of a respective bump electrode,
   wherein, in said step (c), if said bonding wires are used in said semiconductor device, said openings are respectively formed over said first regions and, also, said openings are not formed over said second regions,
   wherein, in said step (c), if said bump electrodes are used in said semiconductor device, said openings are respectively formed over said second regions and, also, said openings are not formed over said first regions, and
   wherein said first wirings are electrically coupled to a power supply potential or a reference potential.

11. A method of manufacturing a semiconductor device according to claim 10, wherein at least some of said first wirings have a plurality of said first regions, such that the number of said first regions is larger than the number of said second regions.

12. A method of manufacturing a semiconductor device according to claim 10, wherein input-output circuit cells are respectively formed under said first regions.

13. A method of manufacturing a semiconductor device according to claim 12, wherein part of said second regions is formed between neighboring input-output circuit cells in plan view.

14. A method of manufacturing a semiconductor device according to claim 13, wherein a digital system circuit or a semiconductor element for preventing ESD is formed over said semiconductor substrate under the part of said second regions formed between said neighboring input-output circuit cells in plan view.

* * * * *